(12) United States Patent
Isaka et al.

(10) Patent No.: US 10,153,460 B2
(45) Date of Patent: Dec. 11, 2018

(54) DISPLAY DEVICE

(71) Applicant: Semiconductor Energy Laboratory Co., Ltd., Atsugi-shi, Kanagawa-ken (JP)

(72) Inventors: Fumito Isaka, Zama (JP); Hisao Ikeda, Zama (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/671,443

(22) Filed: Aug. 8, 2017

(65) Prior Publication Data

US 2018/0053917 A1 Feb. 22, 2018

(30) Foreign Application Priority Data

Aug. 17, 2016 (JP) .................................. 2016-159845

(51) Int. Cl.
*G02F 1/1335* (2006.01)
*H01L 51/52* (2006.01)
(Continued)

(52) U.S. Cl.
CPC .... *H01L 51/5271* (2013.01); *G02F 1/133602* (2013.01); *G09G 3/3225* (2013.01);
(Continued)

(58) Field of Classification Search
CPC ............... H01L 51/527; H01L 27/3232; G02F 1/133602
(Continued)

(56) References Cited

U.S. PATENT DOCUMENTS 6,714,268 B2   3/2004   Wang et al.
7,038,641 B2   5/2006   Hirota et al.
(Continued)

FOREIGN PATENT DOCUMENTS

JP   2001-066593 A   3/2001
JP   2002-196702 A   7/2002
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Hoan C Nguyen
(74) *Attorney, Agent, or Firm* — Robinson Intellectual Property Law Office; Eric J. Robinson

(57) ABSTRACT

A light extraction efficiency is increased in a display device having a plurality of display elements. The display device includes a first display element and a second display element over the first display element, and the first display element has a convex-concave shape. The convex-concave shape overlaps with a first opening provided in a reflective electrode of the second display element. A user can see an image that combines the display from the first display element and the display from the second display element. The convex-concave shape increases the light extraction efficiency of the first display element. The second display element is electrically connected to a transistor through a second opening provided in any layer of the first display element. The second display element can be provided close to the first display element.

14 Claims, 21 Drawing Sheets

(51) Int. Cl.
*H01L 27/32* (2006.01)
*G09G 3/3225* (2016.01)
*G09G 3/36* (2006.01)
*G09G 3/34* (2006.01)

(52) U.S. Cl.
CPC ....... *G09G 3/3648* (2013.01); *H01L 27/3232* (2013.01); *H01L 27/3267* (2013.01); *G09G 3/344* (2013.01); *G09G 2300/046* (2013.01); *G09G 2320/0209* (2013.01); *G09G 2320/0242* (2013.01); *G09G 2330/023* (2013.01); *H01L 27/3258* (2013.01); *H01L 51/5209* (2013.01); *H01L 51/5225* (2013.01)

(58) Field of Classification Search
USPC ......................................................... 349/113
See application file for complete search history.

(56) References Cited

U.S. PATENT DOCUMENTS

| | | | |
|---|---|---|---|
| 7,084,936 B2 | 8/2006 | Kato | |
| 7,102,704 B2 | 9/2006 | Mitsui et al. | |
| 7,176,991 B2 | 2/2007 | Mitsui et al. | |
| 7,239,361 B2 | 7/2007 | Kato | |
| 7,248,235 B2 | 7/2007 | Fujii et al. | |
| 7,385,654 B2 | 6/2008 | Mitsui et al. | |
| 2003/0201960 A1 | 10/2003 | Fujieda | |
| 2004/0072380 A1* | 4/2004 | Yamazaki | H01L 27/3246 438/30 |
| 2004/0125271 A1* | 7/2004 | Wu | G02F 1/1368 349/63 |
| 2006/0072047 A1 | 4/2006 | Sekiguchi | |
| 2008/0180618 A1 | 7/2008 | Fujieda | |
| 2010/0171905 A1 | 7/2010 | Huang et al. | |
| 2012/0293428 A1* | 11/2012 | Yan | H01L 27/3232 345/173 |
| 2015/0171374 A1 | 6/2015 | Burrows et al. | |
| 2015/0362776 A1* | 12/2015 | Jikumaru | H01L 27/124 349/12 |

FOREIGN PATENT DOCUMENTS

| | | |
|---|---|---|
| JP | 2002-328630 A | 11/2002 |
| JP | 2003-076302 A | 3/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 B2 | 10/2008 |
| JP | 2013-221965 A | 10/2013 |
| WO | WO-2004-053819 A | 6/2004 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

* cited by examiner

FIG. 11A
FIG. 11B
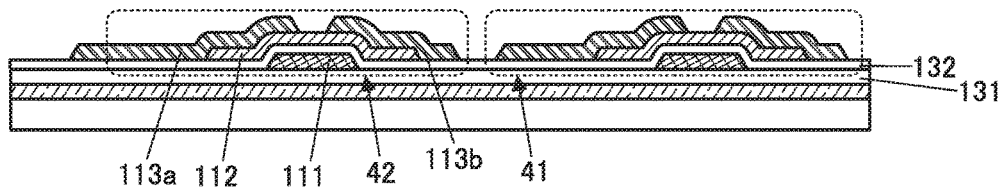
FIG. 11C
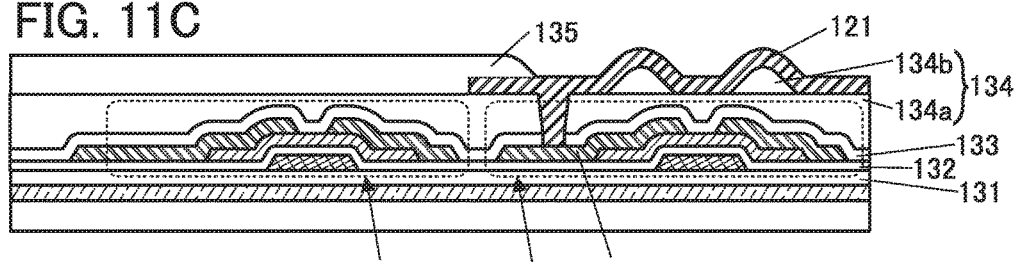
FIG. 11D
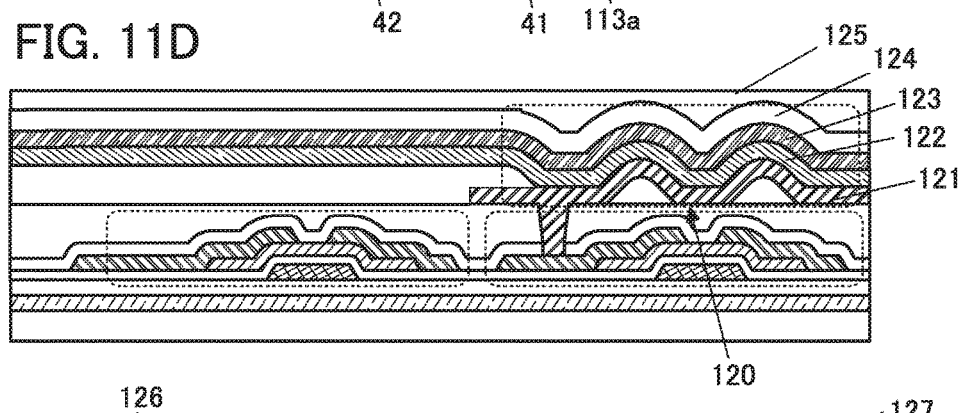
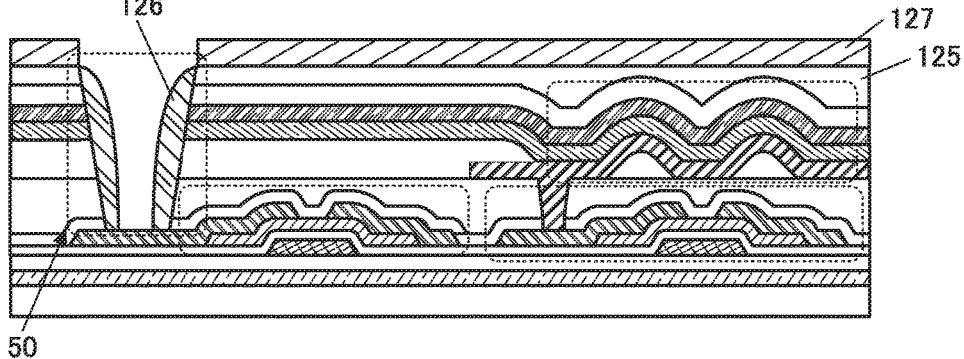
FIG. 11E

DISPLAY DEVICE

BACKGROUND OF THE INVENTION

1. Field of the Invention

One embodiment of the present invention relates to a display device, a display module, and an electronic device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input-output device (e.g., a touch panel), a driving method thereof, and a manufacturing method thereof.

2. Description of the Related Art

In recent years, display devices are promising for a variety of applications. As the display devices, light-emitting devices including light-emitting elements, liquid crystal display devices including liquid crystal elements, and other similar devices have been developed.

For example, Patent Document 1 discloses a display device in which a reflective liquid crystal display device including a liquid crystal display element is combined with an organic EL display device including an organic electroluminescence (EL) element.

REFERENCE

Patent Document

[Patent Document 1] Japanese Published Patent Application No. 2003-76302

SUMMARY OF THE INVENTION

According to FIG. 4 in Patent Document 1, light emission from the organic EL element can be obtained through a transparent region with a small area. However, the extraction efficiency of light emitted from the organic EL element through the transparent region is not examined at all in Patent Document 1. In order to reduce power consumption, the organic EL element in Patent Document 1 has an area almost equal to or smaller than the area of the transparent region.

Furthermore, in Patent Document 1, a common signal line is used and a thin film transistor (TFT) is shared between a light-emitting element and an optical modulation element so as to reduce costs (FIGS. 6 and 7). Since the TFT is shared, the light-emitting element and the optical modulation element need to be controlled independently, and a signal voltage capable of driving both the light-emitting element and the optical modulation element needs to be supplied to the signal line. In addition, according to FIGS. 12 and 13 in Patent Document 1, a light-emitting layer emits no light when a liquid crystal layer is vertically aligned, i.e., when black is displayed, whereas the light-emitting layer emits light when the liquid crystal layer is horizontally aligned, i.e., when white is displayed. This driving is performed with the aforementioned TFT that is shared, and in Patent Document 1, when the organic EL element is driven, a TFT for the liquid crystal layer is not used to control the liquid crystal layer that overlaps with a transparent region. That is, Patent document 1 does not disclose a structure in which the light-emitting layer emits light when black is displayed by the liquid crystal layer.

In view of the above, an object of the present invention is, for example, to improve the extraction efficiency of light emitted from a light-emitting element used in a display device.

Another object of the present invention is, for example, to provide a structure that allows light to be extracted from a light-emitting element while a liquid crystal layer is controlled.

Another object of the present invention is, for example, to further reduce the power consumption of a display device.

Note that the description of these objects does not exclude the existence of other objects. In one embodiment of the present invention, there is no need to achieve all the objects. Other objects can be derived from the description of the specification, the drawings, the claims, and the like.

One embodiment of the present invention is a display device including a first display element and a second display element over the first display element. The first display element has a convex-concave shape. The second display element includes an electrode configured to reflect visible light. The first display element is electrically connected to a first transistor. The second display element is electrically connected to a second transistor through the electrode. Any one of layers included in the first display element includes a first opening. The electrode includes a first region and a second region. The first region includes a second opening overlapping with the convex-concave shape. The second region includes a region provided in the first opening.

One embodiment of the present invention is a display device including a first display element and a second display element over the first display element. The first display element has a convex-concave shape. The second display element includes a first electrode configured to reflect visible light. The second display element includes a second electrode over the first electrode. The first display element is electrically connected to a first transistor. The second display element is electrically connected to a second transistor through the first electrode. Any one of layers included in the first display element includes a first opening. The first electrode includes a first region and a second region. The first region includes a second opening overlapping with the convex-concave shape. The second region includes a region provided in the first opening. The second electrode includes a region overlapping with the second opening.

One embodiment of the present invention can have a structure in which the first display element is over an insulating film, a surface of the insulating film has a first convex-concave shape, and the first display element has a second convex-concave shape along the first convex-concave shape.

In one embodiment of the present invention, the first opening is provided in a light-emitting layer included in the first display element.

One embodiment of the present invention can have a structure in which an electrode of the first display element includes a third region and a fourth region, the third region is covered with a partition, the fourth region includes a region provided in a third opening, a surface of the fourth region has a concave portion, and the concave portion is not covered with the partition.

In one embodiment of the present invention, the first display element can be a light-emitting element and the second display element can be a liquid crystal element.

In one embodiment of the present invention, the first transistor or the second transistor can include a channel formation region formed in a metal oxide layer.

According to one embodiment of the present invention, a display device with improved extraction efficiency of light from a light-emitting element can be provided.

According to one embodiment of the present invention, a display device that can control a liquid crystal layer when light is extracted from a light-emitting element can be provided.

According to one embodiment of the present invention, a display device with further reduced power consumption can be provided.

Note that the description of these effects does not exclude the existence of other effects. In one embodiment of the present invention, there is no need to achieve all the effects. Other effects can be derived from the description of the specification, the drawings, the claims, and the like.

BRIEF DESCRIPTION OF THE DRAWINGS

FIGS. 11A to 11E illustrate an example of a method for manufacturing a display device.
FIGS. 15A, 15B1, 15B2, and 15B3 illustrate an example of a display device.

DETAILED DESCRIPTION OF THE INVENTION

Figure 1A:
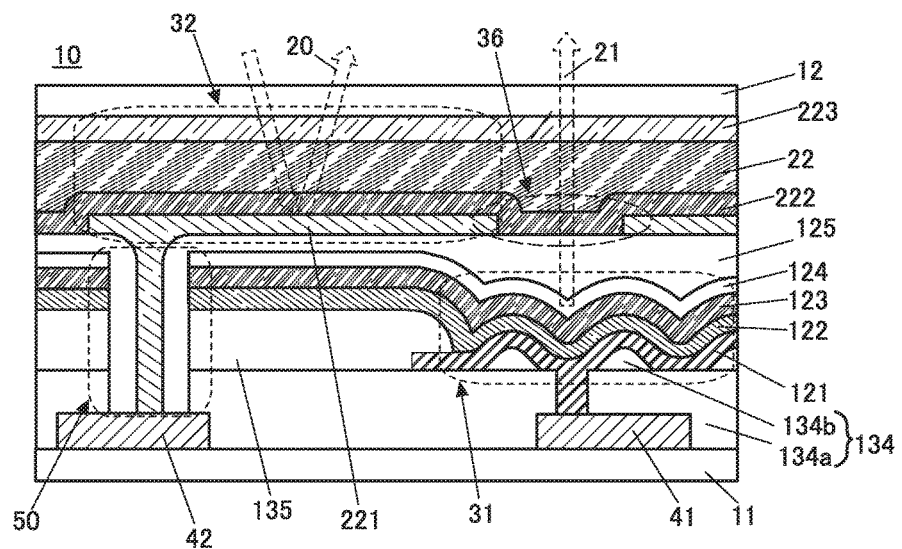
FIGS. 1A and 1B illustrate examples of a display device.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and the description of such portions is not repeated. Furthermore, portions having similar functions are not denoted by reference numerals in some cases.

Note that the ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim or the like in order to avoid confusion among components.

Embodiment 1

In this embodiment, a display device of one embodiment of the present invention will be described with reference to FIGS. 1A and 1B.

A display device 10 illustrated in FIG. 1A includes a first display element 31 and a second display element 32. As the first display element 31, for example, a light-emitting element can be used. The first display element 31 is positioned below the second display element 32. Hence, light 21 is emitted through an opening 36 of an electrode 221 that is included in the second display element 32.

The first display element 31 illustrated in FIG. 1A has a convex-concave shape. For example, an electrode 121 of the first display element 31 has a convex-concave shape. The electrode 121 serves as a cathode or an anode of the light-emitting element. In addition, the electrode 121 has a function of reflecting visible light. That is, the electrode 121, which has a convex-concave shape, has a function of reflecting visible light and can emit light to the opening 36.

A light-emitting layer 122 over the electrode 121 also has a convex-concave shape. In the light-emitting layer 122, functional layers such as a hole-injection layer, a hole-transport layer, an EL layer, an electron-transport layer, and an electron-injection layer are stacked. Since the light-emitting layer 122 has a convex-concave shape, the area of the light-emitting layer 122 over the electrode 121 increases compared with the case where the light-emitting layer 122 has a flat surface. Moreover, the electrode 121 has a function of reflecting visible light, which allows a larger amount of light to be emitted from the light-emitting layer 122 to the opening 36 side. Hence, the light extraction efficiency of the first display element 31 can be improved compared with the case where the light-emitting layer 122 does not have a convex-concave shape. The luminance of the first display element 31 can be increased. An increase in the area of the first display element 31 enables the proportion of the sum of the display areas of the first display element 31 and the second display element 32 to the overall panel size to be greater than or equal to 100%. Furthermore, the lifetime of the first display element 31, i.e., the light-emitting element, can be increased.

Here, a manufacturing method of the electrode 121 with a convex-concave shape is described. The electrode 121, which serves as a reflective electrode, is formed with a thin film of a metal or the like so as to have the reflective function. The thin film of a metal or the like can be formed by a sputtering method, a chemical vapor deposition (CVD) method, a vacuum evaporation method, a molecular beam evaporation method, an ion plating method, an ion beam evaporation method, a laser ablation method, a spray method, a plating method, a sol-gel method, or the like. In many cases, such a thin film is formed along a surface on which the thin film is formed. Therefore, the surface of the insulating layer 134, on which the electrode 121 is to be formed, is formed to have an uneven surface.

An uneven surface of the insulating layer 134 is formed by, for example, stacking insulating layers 134a and 134b and making the upper insulating layer 134b convex. When the convex portion is selectively provided, the insulating layer 134 can have an uneven surface.

The lower insulating layer 134a preferably has a flat surface so that the convex portion can be easily formed thereon. In order to make a choice from a variety of manufacturing conditions of the insulating layer 134b, the insulating layers 134a and 134b are preferably made with different materials. For example, an insulating film is formed using a photosensitive organic material and subjected to exposure to light, development, or baking; thus, the insulating layer 134b with a convex portion can be obtained. For the insulating layer 134a, an acrylic resin or the like, which has a high surface flatness, may be selected. In addition, the maximum difference in height of the insulating layer 134b with the convex portion is preferably larger than that of the insulating layer 134a, in which case the area of the light-emitting layer 122 can be more increased. Furthermore, the side surfaces of the convex portion are preferably gently sloped so that the electrode 121 and the light-emitting layer 122 can be formed over the convex portion without disconnection. The height of each convex portion or the depth of each concave portion is not necessarily uniform. For example, the heights of a plurality of convex portions in FIG. 1A may gradually increase from the center of the opening 36 toward the outside, which allows light to be collected centrally and the luminance to be further increased.

The convex portions are preferably provided in a region that is wider than the region where the opening 36 is provided. In that case, the convex-concave shapes of the electrode 121 and the light-emitting layer 122 are provided inside and outside of the opening 36, so that the light extraction efficiency of the first display element 31 is further increased and a larger amount of light can be collected.

The center region of the opening 36 preferably overlaps with the concave portion as illustrated in FIG. 1A, in which case light-collecting rate increases. In other words, a plurality of convex portions are preferably arranged so as not to overlap with the center region of the opening 36.

Figure 1B:
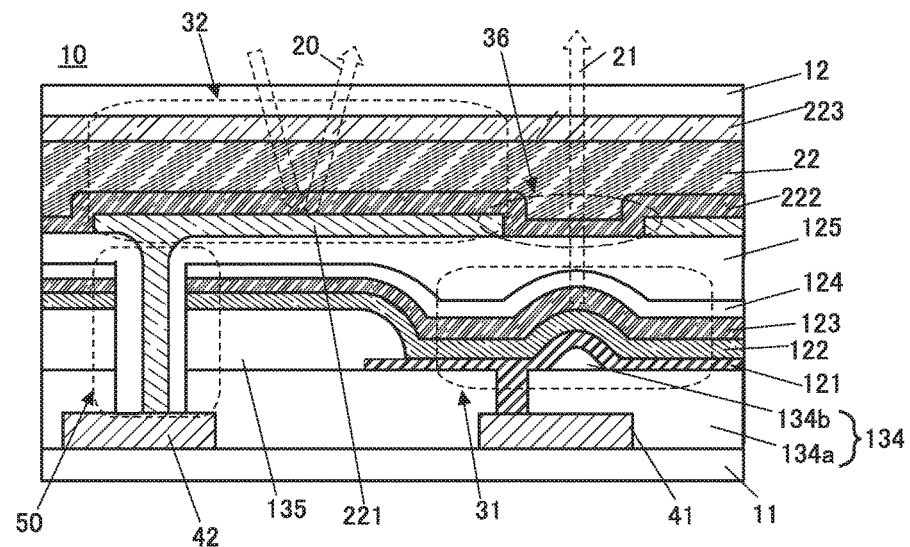

A convex portion may be provided only in a region narrower than the region where the opening 36 is provided as illustrated in, for example, FIG. 1B. Although the number of convex portions in FIG. 1B is smaller than that in FIG. 1A, the insulating layer 134 can have an uneven surface and the area of the light-emitting layer 122 can increase compared with the case where the insulating layer 134 has a flat surface. Since the luminance and the light extraction efficiency of the light-emitting element are increased accordingly, the convex portion may be provided in a region narrower than the region where the opening 36 is provided. The convex-concave shapes of the electrode 121 and the light-emitting layer 122 are provided inside of the opening 36.

The convex-concave shapes of the electrode 121 and the light-emitting layer 122 also have an effect of preventing the mixture of colors in adjacent light-emitting elements. Light from the light-emitting layer 122 is emitted in a random direction, and some light is delivered to an adjacent light-emitting element. The light emitted in a random direction does not have the same intensity and an intense component is emitted in the direction of the opening 36.

Some weak light emitted in a random direction is delivered to an adjacent light-emitting element. To prevent the light from being emitted to the adjacent light-emitting element, for example, the convex-concave shapes of the electrode 121 and the light-emitting layer 122 are preferably positioned outside of the opening 36. With the convex-concave shapes, the light delivered to the adjacent light-emitting element can be collected so as to be emitted through the opening 36. That is, although not illustrated in FIGS. 1A and 1B and the like, the convex-concave shapes of the electrode 121 and the light-emitting layer 122 may be provided only outside of the opening 36. It is needless to say that the convex-concave shapes of the electrode 121 and the light-emitting layer 122 may be provided in a region overlapping with the opening 36.

As another method for forming an uneven surface of the insulating layer 134, a surface of a single insulating layer 134 may be partly removed so that a concave portion can be formed.

The concave portion can also be provided by utilizing an opening where an electrode connected to a transistor 41 is formed. Since a surface of the electrode formed in the opening has a concave portion, this shape may be utilized. The electrode that is provided in the opening and has a concave portion on its surface does not need to be covered with an insulating layer 135.

The uneven surface of the insulating layer 134 can be formed with any of the aforementioned methods.

Next, the insulating layer 135 that covers an end portion of the electrode 121 is formed. The insulating layer 135 serves as a partition. The light-emitting layer 122 extends beyond the insulating layer 135 (see FIG. 1A). In the case where the light-emitting element emits white light, a light-emitting layer is provided in common in all pixels; hence, as illustrated in FIG. 1A, the light-emitting layer 122 extends beyond the insulating layer 135. In the case where color display is performed with the light-emitting element emitting white light, a coloring layer may be provided. When the light-emitting element emits any of red, green, and blue light, a light-emitting layer is provided for every pixel, and thus, an end portion of the light-emitting layer 122 may be positioned over the insulating layer 135. A coloring layer may be provided also in this structure.

A possible cause of degradation of the light-emitting layer 122 is moisture or the like. The entry of moisture or the like into the light-emitting layer 122 can be prevented with an electrode 123 over the light-emitting layer 122. The electrode 123 serves as an anode or a cathode of the light-emitting element. An insulating layer 124 over the electrode 123 is effective in further preventing entry of moisture. The insulating layer 124 preferably contains an inorganic material (e.g., silicon nitride, silicon oxide, aluminum nitride, or aluminum oxide) that can prevent entry of moisture. Since the display area of the first display element 31 can be larger than that in the case where the uneven surface is not provided, the proportion of the non-light-emitting portion to the display area can be reduced to increase the time that elapses before the first display element 31 is turned off.

Next, the second display element 32 illustrated in FIGS. 1A and 1B will be described. As the second display element 32, for example, a liquid crystal element can be used. The second display element 32 includes the electrode 221 having the opening 36, and an electrode 222. The electrode 222 is formed to cover the opening 36. The electrode 221 has a function of reflecting visible light. The electrode 222 has a function of transmitting visible light. The electrodes 221 and 222 are electrically connected to each other, and these electrodes serve as a pixel electrode (a first electrode) of the liquid crystal element. The second display element 32 is electrically connected to a transistor 42 through the pixel electrode.

A substrate 12 is provided with an electrode 223. The electrode 223 serves as a counter electrode (a second electrode). A liquid crystal layer 22 is positioned between the pixel electrode and the counter electrode.

The first display element 31 is electrically connected to the transistor 41. The second display element 32 is electrically connected to the transistor 42. The first display element 31 and the second display element 32 are controlled with the different transistors and therefore, can perform display at the same time. A user can see an image that combines the display from the first display element 31 and the display from the second display element 32.

Description is made on the electrical connection between the second display element 32 and the transistor 42. The transistors 41 and 42 are formed on the same plane; in FIGS. 1A and 1B, they are formed over the substrate 11.

The second display element 32 can be electrically connected to the transistor 42 by providing an opening 50 in the insulating layers 134, 135, the light-emitting layer 122, the electrode 123, the insulating layer 124, and the like. The light-emitting layer 122, the electrode 123, and the like constitute the first display element 31. The electrode 221 and the like of the second display element 32 can be electrically connected to the transistor 42 through the opening 50.

The opening 50 is formed also in the light-emitting layer 122 and the like. In view of a low resistance to moisture or the like of the light-emitting layer 122, the opening 50 is preferably formed by dry etching rather than by wet etching. Note that the opening can be formed by wet etching except when it is formed in the light-emitting layer 122. In addition, since the light-emitting layer 122 is protected by the electrode 123 and the insulating layer 124, it can be formed by wet etching in some cases without influence of moisture or the like.

An insulating layer 125 is provided on side surfaces of the opening 50. The insulating layer 125 is preferably formed so as to have a flat surface on the insulating layer 124 having an uneven surface, in which case the liquid crystal layer 22, the electrode 221, and the like can be favorably formed over the flat surface of the insulating layer 125. In the case where the insulating layer 125 contains an organic material or an inorganic material, the insulating layer 125 may have an increased thickness to have a flat surface. In the case where the insulating layer 125 contains an organic material, the opening 50 is filled with the insulating layer 125 in some cases. In that case, the top surface of the insulating 125 is formed above the top surface of the opening 50.

In order that the electrode 221 can be electrically connected to the transistor 42, the insulating layer 125 needs to have an opening in the opening 50. The insulating layer 125 preferably contains an inorganic material (e.g., silicon nitride, silicon oxide, aluminum nitride, or aluminum oxide) so that an opening can be easily formed in the insulating layer 125. A film of an inorganic material is formed by a sputtering method, a CVD method, an atomic layer deposition (ALD) method, or the like. The ALD method enables the insulating layer 125 to be formed on the side and bottom surfaces of the opening 50 with good coverage. The insulating layer 125 on the bottom surface of the opening 50 can be formed with a reduced thickness when it is formed with good coverage. An opening can be easily formed in the insulating layer 125 with a reduced thickness.

The opening 50 is formed in the following way. The layers in the region where the opening 50 is to be formed are sequentially opened from the top layer. Thus, an end portion of the light-emitting layer 122 is exposed in some cases during the formation of the opening 50. Although the top surface of the light-emitting layer 122 is protected by the electrode 123 and the insulating layer 124, moisture or the like might enter the light-emitting layer 122 through the exposed end portion. The entry of moisture or the like into the light-emitting layer 122 can be prevented when the end portion of the light-emitting layer 122 is covered with the insulating layer 125.

With the above structure, the second display element 32 is provided close to the first display element 31. In other words, the distance between the first display element 31 and the opening 36 in the electrode 221 of the second display element 32 can be reduced. This enables the light 21 from the first display element 31 to be effectively extracted through the opening 36.

In addition, the second display element 32 can be provided above the first display element 31 without bonding or the like, achieving a high alignment accuracy.

The electrode 221 has a function of reflecting visible light, and the second display element 32 is, for example, a reflective liquid crystal element. With the reflective liquid crystal element, light 20 reflects off the electrode 221 and is seen. A reflective liquid crystal element can operate with lower power consumption than a transmissive liquid crystal element. For example, when the display device 10 has a low battery level, an image may be displayed by utilizing only the second display element 32, i.e., the reflective display element, without utilizing the first display element 31.

Since the electrode 221 has a function of reflecting visible light, light from the light-emitting layer 122 can be effectively collected between the electrode 221 and the electrode 121, and the mixture of colors in adjacent light-emitting elements can be prevented.

It is needless to say that the electrode 221 of the second display element 32 may have a function of transmitting visible light; in that case, the second display element 32 is, for example, a transmissive liquid crystal element. The transistor 42 may drive the transmissive liquid crystal element.

The electrode 222 is provided over the electrode 221 of the second display element 32. The electrode 222 has a function of transmitting visible light. The electrode 222 includes, for example, Zn—O, In—Ga—Zn—O, In—Zn—O (IZO), In—Sn—O (ITO), Sn—O, or Ti—O.

The electrode 222 is provided also in the opening 36 of the electrode 221 and contributes to the control of the liquid crystal layer 22 in a region that overlaps with the opening 36. When the first display element 31 is used, the light 21 can be extracted effectively by the control of the liquid crystal layer 22.

As the first display element, a self-luminous light-emitting element such as an organic light-emitting diode (OLED), a micro light-emitting diode (micro-LED), or a quantum-dot light-emitting diode (QLED) can be used. Since the luminance and the chromaticity of light emitted from such a display element are not affected by external light, a clear image that has high color reproducibility (wide color gamut) and a high contrast can be displayed.

As the second display element, a reflective liquid crystal element can be typically used. Alternatively, a micro electro mechanical systems (MEMS) shutter element, an optical interference type MEMS element, an element using a microcapsule method, an electrophoretic method, an electrowetting method, an Electronic Liquid Powder (registered trademark) method, or the like can be used as the second display element.

Transistors will be described.

In each of the transistors 41 and 42, a channel formation region formed in a metal oxide layer is preferably included, so that the off-state currents of the transistors are low and a display device with low power consumption can be provided.

In order to further reduce the off-state current, a capacitor electrically connected to the transistor 41 and a capacitor electrically connected to the transistor 42 may be provided.

The use of the transistor 42 with a low off-state current has the following advantages: when a still image is displayed with the second display element 32 electrically connected to the transistor 42, the writing of a signal to a pixel can be stopped with a gray level maintained, i.e., the same image continues to be displayed with a low frame rate. The low frame rate results in low power driving.

In the case where both of the channel formation regions of the transistors 41 and 42 are formed in metal oxide layers, the metal oxide layers may have different compositions. In each of the channel formation regions, metal oxide layers may be stacked and their compositions may differ. The channel formation region of the transistor 41 and the channel formation region of the transistor 42 may have different structures of metal oxide layers, e.g., the number of stacked metal oxide layers may differ.

A silicon semiconductor may be used in the channel formation regions of the transistors 41 and 42.

The channel formation region of the transistor 41 may be formed in a silicon semiconductor layer while the channel formation region of the transistor 42 is formed in a metal oxide layer. Alternatively, the channel formation region of the transistor 41 may be formed in a metal oxide layer while the channel formation region of the transistor 42 is formed in a silicon semiconductor layer.

Figure 2A:
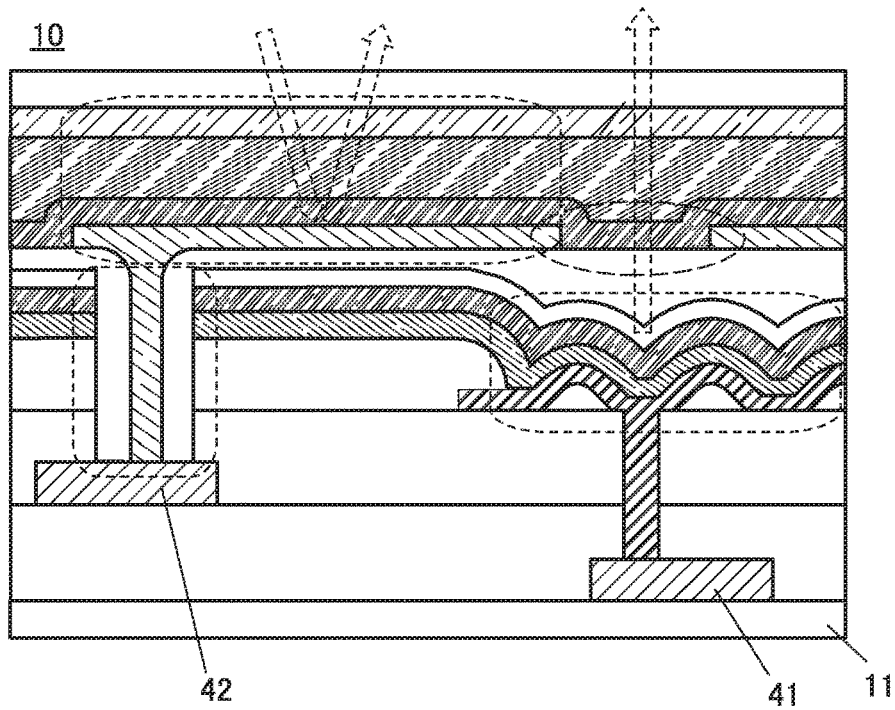
FIGS. 2A and 2B illustrate examples of the display device.
Figure 2B:
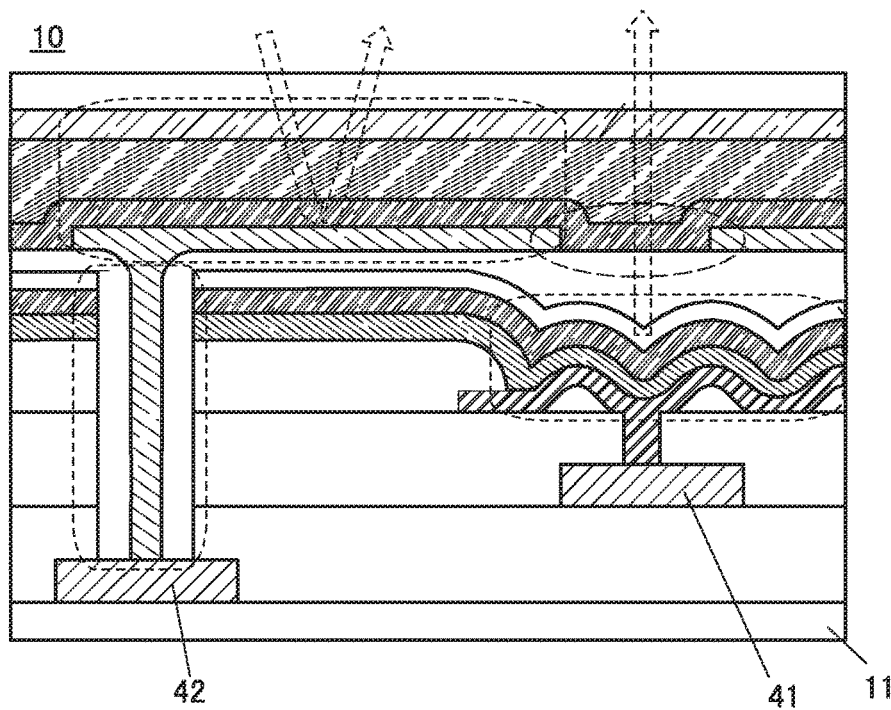

Although the transistors 41 and 42 are positioned over the substrate 11 in FIGS. 1A and 1B, the transistors 41 and 42 may be stacked. For example, the transistor 42 may be positioned above the transistor 41 as illustrated in FIG. 2A, or the transistor 41 may be positioned above the transistor 42 as illustrated in FIG. 2B. The structures in FIGS. 2A and 2B may be combined with any of the other structures as appropriate.

As for the channel formation region, the channel formation regions of the transistors 41 and 42 may be stacked, and other components such as a gate electrode and a gate insulating layer may be formed on the same layer.

FIGS. 7A and 7B and FIGS. 8A and 8B illustrate cross-sectional structure examples of the display device.

Structure Example 1

Figure 7A:
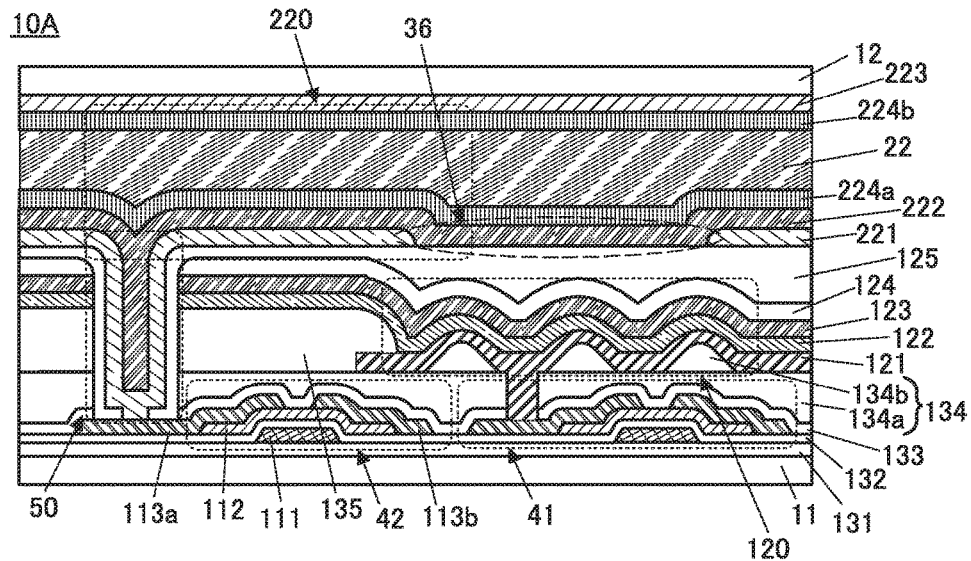
FIGS. 7A and 7B illustrate examples of a display device.

A display device 10A illustrated in FIG. 7A includes the substrate 11, an insulating layer 131, the transistor 41, the transistor 42, an insulating layer 133, the insulating layer 134 (the insulating layers 134a and 134b), a light-emitting element 120, the insulating layer 135, the insulating layer 124, the insulating layer 125, a liquid crystal element 220, an alignment film 224a, an alignment film 224b, the electrode 223, the substrate 12, and the like.

The transistors 41 and 42 are positioned on the same plane. FIG. 7A shows an example in which the transistors 41 and 42 are positioned over the insulating layer 131. The transistors 41 and 42 may be positioned on different surfaces as illustrated in FIGS. 2A and 2B.

The transistor 41 is electrically connected to the light-emitting element 120 whereas the transistor 42 is electrically connected to the liquid crystal element 220. The light-emitting element 120 is positioned above the transistor 41. The liquid crystal element 220 is positioned above the transistor 42. The liquid crystal element 220 is positioned above the light-emitting element 120.

In the light-emitting element 120, an end portion of the light-emitting layer 122 and an end portion of the electrode 123 are not positioned over the insulating layer 135. That is, the light-emitting layer 122 is not provided for every pixel but is provided in adjacent pixels in common.

A glass substrate can be used as each of the substrates 11 and 12. The substrates 11 and 12 preferably have flexibility, and a plastic film or the like may be used as a flexible support. The flexible support has a low heat resistance in some cases. In that case, an element layer may be transferred from the glass substrate onto the flexible support. In the transferring process, the element layer and the flexible support are bonded with an adhesive layer. Alternatively, the flexible support may be formed over the glass substrate and the element layer may be formed thereover; then, the glass substrate is removed so that the display device can have flexibility. The flexible display device is extremely supple and can be thin and lightweight.

A polarizer, a circular polarizer, or the like may be provided outside of each of the substrates 11 and 12.

The transistors 41 and 42 illustrated in FIG. 7A each have a bottom-gate structure.

The transistors 41 and 42 each include a conductive layer 111, the insulating layer 132, a semiconductor layer 112, a conductive layer 113a, and a conductive layer 113b. The conductive layer 111 overlaps with the semiconductor layer 112 with the insulating layer 132 positioned therebetween. The semiconductor layer 112 includes a channel formation region. The conductive layers 113a and 113b are electrically connected to the semiconductor layer 112.

The conductive layer 111 serves as a gate. The insulating layer 132 serves as a gate insulating layer. One of the conductive layers 113a and 113b serves as a source and the other serves as a drain. The insulating layer 133 can serve as a protective layer of the transistors.

The transistors 41 and 42 are each a channel-etched transistor and can be suitably used for a high-resolution display device because the occupation area of the transistor can be reduced comparatively easily.

The semiconductor layer 112 preferably includes a metal oxide; alternatively, the semiconductor layer 112 may include a silicon semiconductor.

The light-emitting element 120 includes the electrode 121, the light-emitting layer 122, and the electrode 123. The light-emitting layer 122 is positioned between the electrode 121 and the electrode 123. The light-emitting layer 122 contains at least a light-emitting substance. The electrode 121 preferably has a function of reflecting visible light. The electrode 123 has a function of transmitting visible light.

When a voltage is applied between the electrode 121 and the electrode 123, the light-emitting element 120 emits light that is delivered to the substrate 12 side.

The electrode 121 is provided for every pixel and serves as a pixel electrode. The light-emitting layer 122 and the electrode 123 are shared by a plurality of pixels. In a region that is not illustrated, the electrode 123 is connected to a wiring supplied with a constant potential, and serves as a common electrode.

The electrode 121 is electrically connected to the conductive layer 113a of the transistor 41 through an opening formed in the insulating layer 134a. An end portion of the electrode 121 is covered with the insulating layer 135.

The insulating layer 124 is provided over the electrode 123. The insulating layer 124 over the light-emitting element 120 prevents impurities from entering the light-emitting element 120 and allows increasing of the reliability of the light-emitting element 120. In particular, the insulating layer 124 preferably includes an inorganic insulating layer to further increase the reliability of the light-emitting element 120.

The liquid crystal element 220 includes the electrode 221 having a function of reflecting visible light, the liquid crystal layer 22, and the electrode 223 having a function of transmitting visible light. The liquid crystal element 220 also includes the electrode 222 electrically connected to the electrode 221. The liquid crystal layer 22 is positioned between the alignment film 224a and the alignment film 224b. The electric field generated between the electrode 221 and the electrode 223 controls the alignment of the liquid crystal layer 22, so that the liquid crystal element 220 can emit reflected light to the substrate 12 side.

The electrode 221 is provided for every pixel and serves as a pixel electrode. The electrode 221 includes the opening 36. The light-emitting element 120 is positioned so as to overlap with the opening 36 in order that light from the light-emitting element 120 can emit through the opening 36.

The electrode 223 is shared by a plurality of pixels. In a region that is not illustrated, the electrode 223 is connected to a wiring supplied with a constant potential, and serves as a common electrode.

In the display device 10A illustrated in FIG. 7A, the liquid crystal element 220 does not include a color filter. Hence, the display device 10A can display a black-and-white image or a grayscale image with use of the liquid crystal element 220.

The insulating layers 124, 134, and 135, the light-emitting layer 122, and the electrode 123 include the opening 50 in a position that overlaps with the conductive layer 113a of the transistor 42.

The insulating layer 125 is over the insulating layer 124 and covers side surfaces of the opening 50 in order to prevent contamination of the light-emitting layer 122, which is exposed in the opening 50, with moisture or the like. The insulating layer 125 includes an opening in a position that overlaps with the conductive layer 113a of the transistor 42. The opening is formed in a position that overlaps with the opening 50 and has a diameter smaller than that of the opening 50. Through this opening, the transistor 42 is electrically connected to the liquid crystal element 220.

The insulating layer 125 preferably contains an inorganic material, in which case the side surfaces of the light-emitting layer 122, which are exposed in the opening 50, can be protected effectively.

Side surfaces of the electrode 123 are also exposed when the opening 50 is provided. The insulating layer 125 can cover also the side surfaces of the electrode 123. Accordingly, the electrode 221 of the liquid crystal element 220 can be electrically insulated from the electrode 123 of the light-emitting element 120, which prevents a short-circuit. Furthermore, even when the light-emitting layer 122 has high conductivity, the electrode 221 of the liquid crystal element 220 is electrically insulated from the light-emitting layer 122 by the insulating layer 125; thus, there is no damage on both the light-emitting element 120 and the liquid crystal element 220.

In the display device of this embodiment, the transistor 41, which is electrically connected to the light-emitting element 120, and the transistor 42, which is electrically connected to the liquid crystal element 220, are positioned on the same plane. In that case, the thickness or the weight of the display device 10A can be smaller than that in the case where the two transistors are formed on different planes. In addition, since the two transistors can be fabricated in the same process, the fabrication process can be simplified compared with the case where the two transistors are formed on different planes.

Figure 7B:
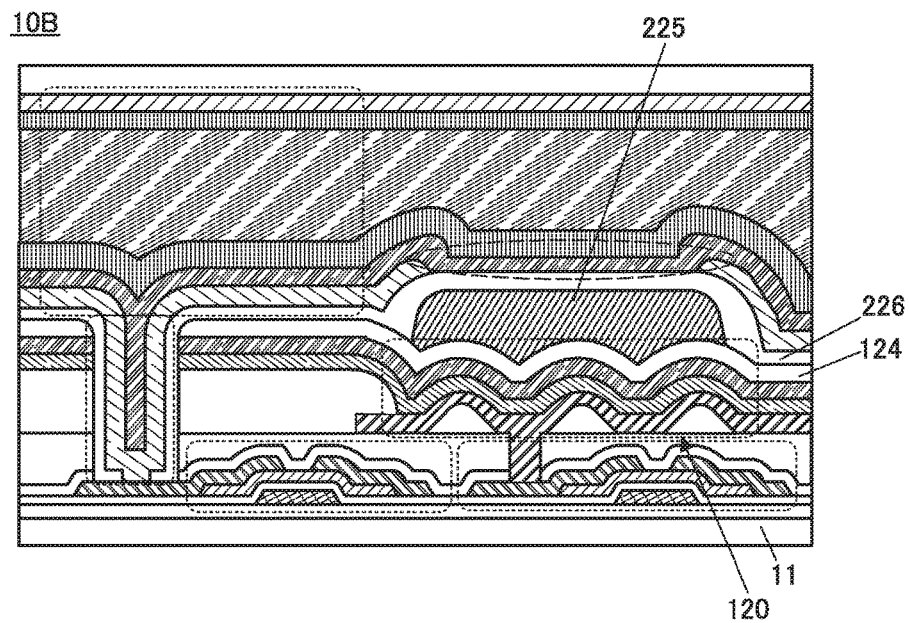

A display device 10B illustrated in FIG. 7B includes a coloring layer 225. The other structures are similar to those in FIG. 7A, and thus, the description thereof is omitted.

A color filter can be used as the coloring layer 225. The coloring layer 225 is provided to display color images with the light-emitting element 120. Hence, the coloring layer 225 is positioned so as to overlap with the light-emitting element 120. In the case where color images are displayed with the coloring layer 225, the light-emitting element 120 may emit white light. The light-emitting element 120 emitting white light does not need to be provided for every pixel. In a structure where the light-emitting element 120 emits red, green, or blue light, a bright color can be obtained with the coloring layer 225.

The coloring layer 225 may be provided in a region that is wider than the region where the light-emitting element 120 is provided. In other words, an end portion of the coloring layer 225 may extend beyond the light-emitting element 120. For example, the end portion of the coloring layer 225 may overlap with the insulating layer 135. The coloring layer 225 is provided over the insulating layer 124. The coloring layer 225 contains an organic material. Thus, the coloring layer 225 has a flat surface even when the insulating layer 124 has an uneven surface. The insulating layer 226 is provided to cover the coloring layer 225 in order to reduce the diffusion of impurities and the like from the coloring layer 225. The insulating layer 226 contains an inorganic material. Thus, the insulating layer 226 is raised in a region that overlaps with the coloring layer 225.

The insulating layer 226 is provided also in the opening 50. The insulating layer 226 is formed so as to cover the end portions of the light-emitting layer 122 and the electrode 123 that are exposed in the opening 50. The insulating layer 226 has a function similar to that of the insulating layer 125 illustrated in FIG. 7A.

In the display device 10B thus illustrated in FIG. 7B, a color image can be displayed with the light-emitting element 120. Further, in the display device 10B, a black-and-white image or a grayscale image can be displayed with the liquid crystal element 220.

Figure 8A:
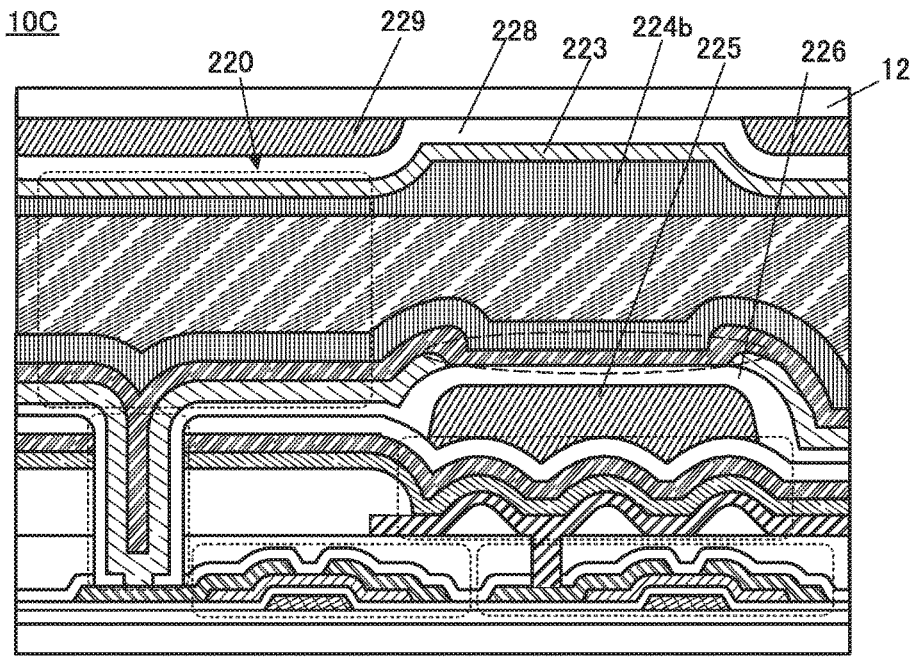
FIGS. 8A and 8B illustrate examples of a display device.

A display device 10C illustrated in FIG. 8A includes a coloring layer 229. The other structures are similar to those in FIG. 7B, and thus, the description thereof is omitted.

A color filter can be used as the coloring layer 229. The coloring layer 229 is provided to display color images with the liquid crystal element 220. Hence, the coloring layer 229 is positioned so as to overlap with the liquid crystal element 220. The coloring layer 229 is provided in a region that is wider than the region where the liquid crystal element 220 is provided. In other words, an end portion of the coloring layer 229 may extend beyond the liquid crystal element 220. The coloring layer 229 is provided on the substrate 12 side. The coloring layer 229 contains an organic material. An insulating layer 228 is provided to cover the coloring layer 229 in order to reduce the diffusion of impurities and the like from the coloring layer 229. The insulating layer 228 serves as an overcoat layer. The insulating layer 228 contains an inorganic material. Thus, the insulating layer 228 has a surface along the shape of the coloring layer 229.

The thickness of the coloring layer 229 may be smaller than that of the coloring layer 225. Preferably, the thickness of the coloring layer 229 is greater than or equal to 40% and less than or equal to 60% of the thickness of the coloring layer 225. This is because light passes through the coloring layer 225 only once in the light-emitting element 120, whereas in the liquid crystal element 220, light passes through the coloring layer 229 twice, i.e., light moves back and forth.

The coloring layer 229 only needs to overlap with the liquid crystal element 220 and does not need to overlap with the coloring layer 225. The coloring layers 229 and 225 may have the same color or different colors.

The electrode 223 of the liquid crystal element 220 is formed on the insulating layer 228, and the alignment film 224b is formed.

In the display device 10C thus illustrated in FIG. 8A, color images can be displayed with the light-emitting element 120 and the liquid crystal element 220.

Figure 8B:
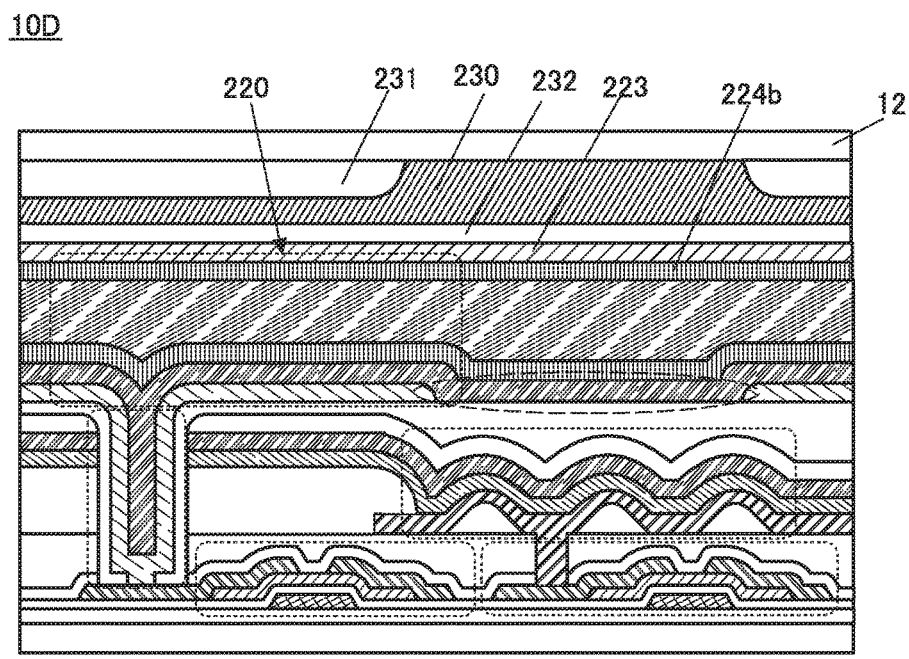

A display device 10D illustrated in FIG. 8B includes a coloring layer 230 and does not include the coloring layer 225 and the like. The other structures are similar to those in FIG. 7A, and thus, the description thereof is omitted.

The coloring layer 230 is provided on the substrate 12 side in order that color images can be displayed with the liquid crystal element 220 and the light-emitting element 120. Accordingly, the coloring layer 230 is positioned to overlap with both the liquid crystal element 220 and the light-emitting element 120. The thickness of the coloring layer 230 in a region overlapping with the liquid crystal element 220 may be smaller than that in a region overlapping with the light-emitting element 120. The thickness of the coloring layer 230 can be changed by an insulating layer 231 provided on the substrate 12 side. An opening may be formed in part of the insulating layer 231 that overlaps with the light-emitting element 120.

The coloring layer 230 contains an organic material. Thus, the coloring layer 230 can have a flat surface. An insulating layer 232 is provided to cover the coloring layer 230 in order to reduce the diffusion of impurities and the like from the coloring layer 230. The insulating layer 232 contains an inorganic material.

The electrode 223 of the liquid crystal element 220 is formed on the insulating layer 232, and the alignment film 224b is formed.

In the display device 10D thus illustrated in FIG. 8B, color images can be displayed with the light-emitting element 120 and the liquid crystal element 220. Since the coloring layer on the light-emitting element side is omitted, the light-emitting element can be kept close to the opening 36. In addition, provided only on the substrate 12 side, the coloring layer can be formed at a low cost.

Figure 9A:
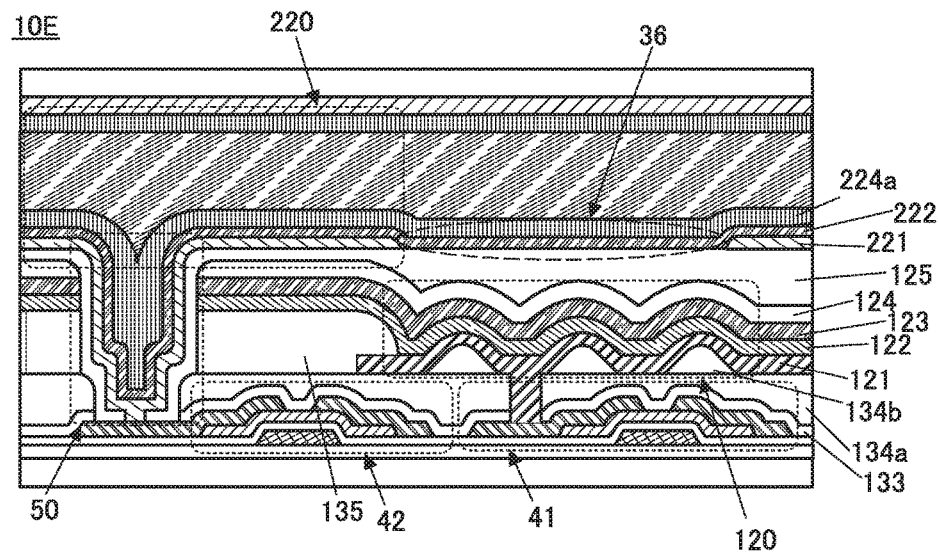
FIGS. 9A and 9B illustrate examples of a display device.

A display device 10E illustrated in FIG. 9A shows a modification example of the opening 50 in FIG. 7A. The other structures are similar to those in FIG. 7A, and thus, the description thereof is omitted.

The opening 50 is formed in the insulating layers 133, 134a, and 135, the light-emitting layer 122, the electrode 123, and the insulating layer 124. Shown here is an example in which the diameter of the opening 50 gradually decreases from the top surface to the bottom surface. That is, the structure of the opening 50 is as follows: the width of the opening in the insulating layers 133 and 134a is smaller than the width of the opening in the insulating layer 135, the light-emitting layer 122, the electrode 123, and the insulating layer 124.

The insulating layer 125, which is provided to cover the side surfaces of the opening 50, is easily formed in the opening 50 whose diameter gradually decreases from the top surface to the bottom surface as illustrated in FIG. 9A. More preferably, the side surfaces of the opening 50 are sloped so as to form the insulating layer 125 more easily.

The modification example of the opening 50 illustrated in FIG. 9A can be applied to the structures of FIG. 7B and FIGS. 8A and 8B.

Figure 9B:
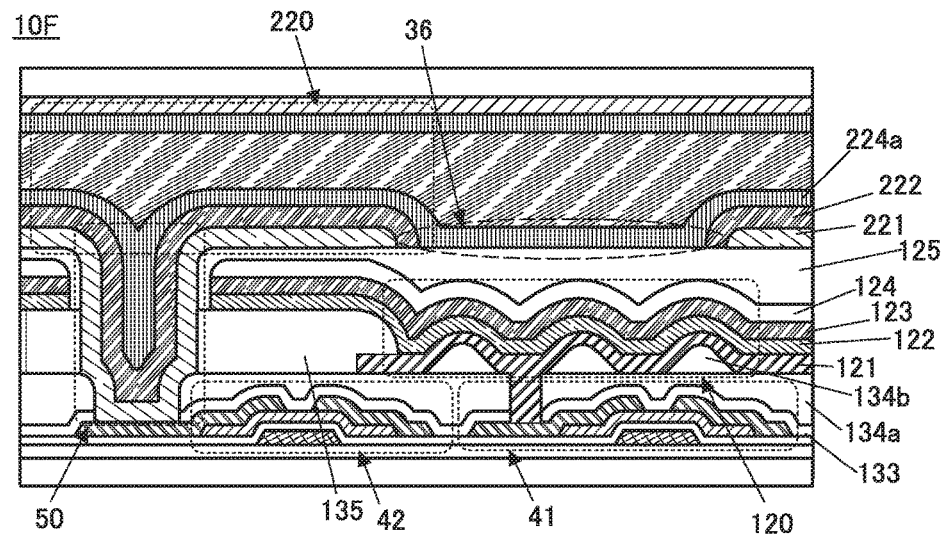

A display device 10F illustrated in FIG. 9B shows a modification example of the opening 50 in FIG. 7A. The other structures are similar to those in FIG. 7A, and thus, the description thereof is omitted.

As in FIG. 9A, the opening 50 is formed in the insulating layers 133, 134a, and 135, the light-emitting layer 122, the electrode 123, and the insulating layer 124, and the width of the opening in the insulating layers 133 and 134a is smaller than the width of the opening in the insulating layer 135, the light-emitting layer 122, the electrode 123, and the insulating layer 124.

When the insulating layer 125 provided on the side surfaces of the opening 50 covers the side surface of the light-emitting layer 122, degradation of the light-emitting layer 122 due to moisture or the like can be reduced. Hence, the insulating layer 125 can be provided only on the upper portion of the opening 50. Specifically, the insulating layer 125 is provided so as to cover the top surface of the insulating layer 135, the side surface of the light-emitting layer 122, the side surface of the electrode 123, and the side surface of the insulating layer 124.

In the structure illustrated in FIG. 9B, the insulating layer 125 does not need to have an opening through which the electrode 221 of the liquid crystal element 220 is electrically connected to the transistor 42. The conductive layer 113a is exposed in the bottom surface of the opening 50 because the insulating layer 125 is not provided thereon; thus, the electrode 221 can be formed in the opening 50.

Furthermore, the light-emitting layer 122 may be separately colored in FIG. 9B. In the case where the light-emitting layer 122 is separately colored for red light, green light, and blue light, color display can be performed. When the light-emitting layer 122 is separately colored, no coloring layer is needed. It is needless to say that coloring layers corresponding to red, green, and blue light-emitting layers may be provided in order to display images more clearly.

The modification example of the opening 50 illustrated in FIG. 9B can be applied to the structures of FIG. 7B and FIGS. 8A and 8B.

The structures of the transistors will be described.

There is no particular limitation on the structure of the transistor included in the display device in one embodiment of the present invention. For example, a planar transistor, a staggered transistor, or an inverted staggered transistor may be used. A top-gate transistor or a bottom-gate transistor may be used. Gate electrodes may be provided above and below a channel.

Figure 10A:
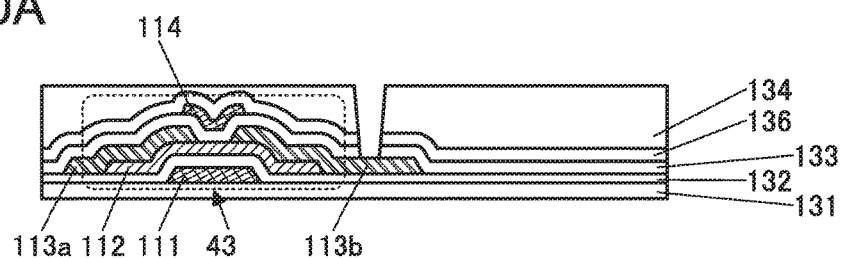
FIGS. 10A to 10C illustrate examples of a transistor.
Figure 10B:
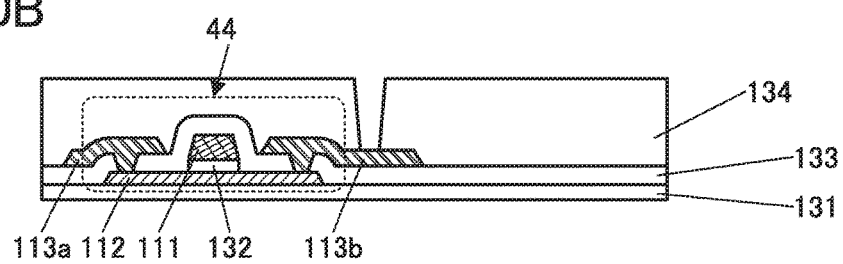
Figure 10C:
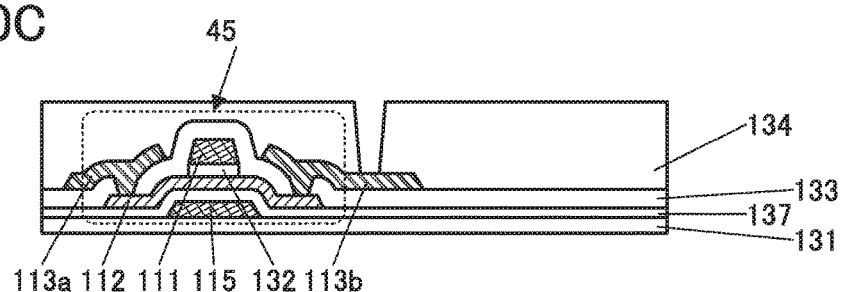

FIGS. 10A to 10C illustrate examples of transistors each having a structure different from that of the transistor 41 or 42 described above in this specification.

A transistor 43 illustrated in FIG. 10A includes a conductive layer 114 in addition to the components of the transistors 41 and 42. The conductive layer 114 is provided over the insulating layer 133 and includes a region that overlaps with the semiconductor layer 112. Furthermore, in FIG. 10A, an insulating layer 136 is provided to cover the conductive layer 114 and the insulating layer 133.

The conductive layer 114 is positioned to face the conductive layer 111 with the semiconductor layer 112 therebetween. In the case where the conductive layer 111 is used as a first gate electrode, the conductive layer 114 can serve as a second gate electrode. By supplying the same potential to the conductive layer 111 and the conductive layer 114, the on-state current of the transistor 43 can be increased. The threshold voltage of the transistor 43 can be controlled when a potential for controlling the threshold voltage is supplied to one of the conductive layers 111 and 114 and a potential for driving is supplied to the other.

A conductive material including an oxide is preferably used for the conductive layer 114. In that case, a conductive film to be the conductive layer 114 is formed in an atmosphere containing oxygen, whereby oxygen can be supplied to the insulating layer 133. The proportion of an oxygen gas in a film formation gas is preferably higher than or equal to 90% and lower than or equal to 100%. Oxygen supplied to the insulating layer 133 is supplied to the semiconductor layer 112 by heat treatment to be performed later, so that oxygen vacancies in the semiconductor layer 112 can be reduced.

In particular, an oxide semiconductor whose resistance is reduced is preferably used for the conductive layer 114. In this case, the insulating layer 136 is preferably formed using an insulating film that releases hydrogen, e.g., a silicon nitride film. Hydrogen is supplied to the conductive layer 114 during the formation of the insulating layer 136 or by heat treatment to be performed after that, whereby the electrical resistance of the conductive layer 114 can be reduced effectively.

A transistor 44 illustrated in FIG. 10B is a top-gate transistor.

The transistor 44 includes the conductive layer 111, the insulating layer 132, the semiconductor layer 112, the insulating layer 133, the conductive layer 113a, and the conductive layer 113b. The conductive layer 111 overlaps with the semiconductor layer 112 with the insulating layer 132 positioned therebetween. The conductive layers 113a and 113b are electrically connected to the semiconductor layer 112.

The conductive layer 111 serves as a gate electrode. The insulating layer 132 serves as a gate insulating layer. The width of the conductive layer 111 is equal to that of the insulating layer 132. One of the conductive layers 113a and 113b serves as a source and the other serves as a drain.

In the transistor 44, the conductive layer 111 can be physically distanced from the conductive layer 113a or 113b easily, which allows reducing of the parasitic capacitance between the conductive layer 111 and the conductive layer 113a or 113b.

A transistor 45 illustrated in FIG. 10C includes a conductive layer 115 and an insulating layer 137 in addition to the components of the transistor 44. The conductive layer 115 is provided over the insulating layer 131 and includes a region that overlaps with the semiconductor layer 112. The insulating layer 137 is provided to cover the conductive layer 115 and the insulating layer 131.

The conductive layer 115 serves as a second gate electrode like the conductive layer 114 illustrated in FIG. 10A. Thus, the on-state current can be increased and the threshold voltage can be controlled, for example.

Note that thin films included in the display device (e.g., insulating films, semiconductor films, or conductive films) can be formed by any of a sputtering method, a CVD method, a vacuum evaporation method, a pulsed laser deposition (PLD) method, an ALD method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Thin films included in the display device (e.g., insulating films, semiconductor films, or conductive films) can also be formed by a method such as spin coating, dipping, spray coating, ink-jetting, dispensing, screen printing, or offset printing, or with a doctor knife, a slit coater, a roll coater, a curtain coater, or a knife coater.

Thin films included in the display device can be processed by a lithography method or the like. Alternatively, island-shaped thin films may be formed by a film formation method using a blocking mask. A nanoimprinting method, a sandblasting method, a lift-off method, or the like may also be used for the processing of thin films. Examples of a photolithography method include a method in which a resist material is formed over a thin film to be processed, the thin film is processed by etching or the like, and the resist mask is removed, and a method in which a photosensitive thin film is formed and then exposed to light and developed to be processed into a desired shape.

In the case where light is used in a lithography method, as light used for exposure, for example, light with an i-line (wavelength: 365 nm), light with a g-line (wavelength: 436 nm), light with an h-line (wavelength: 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use EUV, X-rays, or an electron beam because extremely minute processing can be performed. Note that in the case where exposure is performed by scanning of a beam such as an electron beam, a photomask is not needed.

Thin films can be etched a dry etching method, a wet etching method, a sandblast method, or the like.

Manufacturing Method Example

An example of the method for manufacturing the display device 10A illustrated in FIG. 7A will be described below with reference to FIG. 11A to FIG. 14B.

First, a separation layer 62 is formed over a substrate 61 (FIG. 11A).

The substrate 61 has stiffness high enough for easy transfer and has resistance to heat applied in the manufacturing process. Examples of a material that can be used for the substrate 61 include glass, quartz, ceramic, sapphire, a resin, a semiconductor, a metal, and an alloy. Examples of the glass include alkali-free glass, barium borosilicate glass, and aluminoborosilicate glass.

The separation layer 62 may be formed over the whole or part of the substrate 61.

The separation layer 62 can be formed using an organic material or an inorganic material.

In the case where the separation layer 62 is formed using an organic material, a photosensitive material is preferably used, and a photosensitive and thermosetting material is further preferably used.

A film formed using a photosensitive material can be partly removed by a photolithography method. Specifically, after a film of a material is formed, heat treatment (also referred to as pre-baking treatment) for removing a solvent is performed. Then, light exposure is performed using a photomask and development treatment is performed, so that an unnecessary portion is removed. After that, heat treatment (also referred to as post-baking treatment) is performed. The post-backing treatment is preferably performed at a temperature higher than the formation temperature of each layer formed over the separation layer 62. For example, the heating temperature is preferably higher than or equal to 350° C. and lower than or equal to 450° C., further preferably lower than or equal to 400° C., and still further preferably lower than or equal to 375° C. In this manner, degasification from the separation layer 62 can be significantly suppressed in the manufacturing step of the transistor.

The separation layer 62 is preferably formed using a photosensitive polyimide (PSPI) resin.

Other examples of the organic material that can be used for the separation layer 62 include an acrylic resin, an epoxy resin, a polyamide resin, a polyimide-amide resin, a siloxane resin, a benzocyclobutene-based resin, and a phenol resin.

The separation layer 62 is preferably formed with a spin coater. The spin coating method enables the formation of a uniform thin film over a large substrate.

The separation layer 62 is preferably formed using a solution with a viscosity greater than or equal to 5 cP and less than 500 cP, further preferably greater than or equal to 5 cP and less than 100 cP, and still further preferably greater than or equal to 10 cP and less than or equal to 50 cP. The lower the viscosity of the solution is, the easier the coating is. Furthermore, the lower the viscosity of the solution is, the more the entry of bubbles can be prevented, which leads to a film with good quality.

In the case where an organic material is used, the thickness of the separation layer 62 is preferably greater than or equal to 0.01 μm and less than 10 μm, further preferably greater than or equal to 0.1 μm and less than or equal to 3 μm, and still further preferably greater than or equal to 0.5 μm and less than or equal to 1 μm. With the use of a solution with low viscosity, the separation layer 62 can be easily made thin. When the thickness of the separation layer 62 is within the above range, the manufacturing cost can be reduced. Note that the thickness of the separation layer 62 is not limited thereto, and may be greater than or equal to 10 μm, for example, greater than or equal to 10 μm and less than or equal to 200 μm.

Alternatively, the separation layer 62 can be formed by dipping, spray coating, ink-jetting, dispensing, screen printing, or offset printing, or with a doctor knife, a slit coater, a roll coater, a curtain coater, or a knife coater, for example.

Examples of an inorganic material that can be used for the separation layer 62 include a metal containing an element selected from tungsten, molybdenum, titanium, tantalum, niobium, nickel, cobalt, zirconium, zinc, ruthenium, rhodium, palladium, osmium, iridium, and silicon, an alloy containing the element, and a compound containing the element. A crystal structure of a layer containing silicon may be amorphous, microcrystal, or polycrystal.

In the case where an inorganic material is used, the thickness of the separation layer 62 is greater than or equal to 1 nm and less than or equal to 1000 nm, preferably greater than or equal to 10 nm and less than or equal to 200 nm, and further preferably greater than or equal to 10 nm and less than or equal to 100 nm.

In the case where an inorganic material is used, the separation layer 62 can be formed by, for example, a sputtering method, a CVD method, an ALD method, or an evaporation method.

Then, the insulating layer 131 is formed over the separation layer 62 (FIG. 11B).

The insulating layer 131 can be used as a barrier layer that prevents the diffusion of impurities contained in the separation layer 62 into a transistor and a display element to be formed later. In the case where an organic material is used for the separation layer 62, the insulating layer 131 preferably prevents moisture or the like contained in the separation layer 62 from diffusing into a transistor and a display element when the separation layer 62 is heated. For that reason, the insulating layer 131 preferably has a high barrier property.

As the insulating layer 131, for example, an inorganic insulating film such as a silicon nitride film, a silicon oxynitride film, a silicon oxide film, a silicon nitride oxide film, an aluminum oxide film, or an aluminum nitride film can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. Two or more of the above insulating films may be stacked. In the case where a stacked film is used, preferably, a silicon nitride film is formed over the separation layer 62 and a silicon oxide film is formed over the silicon nitride film.

An inorganic insulating film is preferably formed at high temperatures because the film can have higher density and a higher barrier property as the deposition temperature becomes higher.

The substrate temperature during the deposition of the insulating layer 131 is preferably higher than or equal to room temperature (25° C.) and lower than or equal to 350° C., and further preferably higher than or equal to 100° C. and lower than or equal to 300° C.

Then, the transistors 41 and 42 are formed over the insulating layer 131 (FIG. 11B).

There is no particular limitation on a semiconductor material used for the semiconductor layer of the transistor, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

In the example shown here, a bottom-gate transistor including an oxide semiconductor layer as the semiconductor layer 112 is formed.

An oxide semiconductor is preferably used as the semiconductor of the transistor. The use of a semiconductor material having a wider band gap and a lower carrier density than silicon can reduce the off-state current of the transistor.

Specifically, first, the conductive layer 111 is formed over the insulating layer 131 (FIG. 11B). The conductive layer 111 can be formed in the following manner: a conductive film is formed, a resist mask is formed, the conductive film is etched, and the resist mask is removed.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or indium tin oxide containing silicon may be used. Alternatively, a semiconductor such as an oxide semiconductor or polycrystalline silicon whose resistance is lowered by, for example, containing an impurity element, or silicide such as nickel silicide may be used. A film including graphene may be used as well. The film including graphene can be formed by, for example, reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, the insulating layer 132 is formed (FIG. 11B). The insulating layer 132 can be formed using an inorganic insulating film that can be used as the insulating layer 131.

Then, the semiconductor layer 112 is formed (FIG. 11B). In this embodiment, an oxide semiconductor layer is formed as the semiconductor layer 112. The oxide semiconductor layer can be formed in the following manner: an oxide semiconductor film is formed, a resist mask is formed, the oxide semiconductor film is etched, and the resist mask is removed.

The substrate temperature during the deposition of the oxide semiconductor film is preferably lower than or equal to 350° C., further preferably higher than or equal to room temperature and lower than or equal to 200° C., and still further preferably higher than or equal to room temperature and lower than or equal to 130° C.

The oxide semiconductor film can be formed using one or both of an inert gas and an oxygen gas. Note that there is no particular limitation on the percentage of oxygen gas flow rate (partial pressure of oxygen) at the time of forming the oxide semiconductor film. To fabricate a transistor having high field-effect mobility, however, the percentage of oxygen gas flow rate (partial pressure of oxygen) at the time of forming the oxide semiconductor film is preferably higher than or equal to 0% and lower than or equal to 30%, further preferably higher than or equal to 5% and lower than or equal to 30%, and still further preferably higher than or equal to 7% and lower than or equal to 15%.

The oxide semiconductor film preferably contains at least indium or zinc. It is particularly preferable to contain indium and zinc.

The energy gap of the oxide semiconductor is preferably 2 eV or more, further preferably 2.5 eV or more, and still further preferably 3 eV or more. The use of such an oxide semiconductor having a wide energy gap leads to a reduction in the off-state current of a transistor.

The oxide semiconductor film can be formed by a sputtering method. Alternatively, a PLD method, a PECVD method, a thermal CVD method, an ALD method, a vacuum evaporation method, or the like may be used.

Then, the conductive layers 113a and 113b are formed (FIG. 11B). The conductive layers 113a and 113b can be formed in the following manner: a conductive film is formed, a resist mask is formed, the conductive film is etched, and the resist mask is removed. Each of the conductive layers 113a and 113b is electrically connected to the semiconductor layer 112.

Note that during the processing of the conductive layers 113a and 113b, the semiconductor layer 112 might be partly etched to be thin in a region not covered by the resist mask.

Through the above steps, the transistors 41 and 42 can be manufactured (FIG. 11B). In the transistors 41 and 42, part of the conductive layer 111 serves as a gate electrode, part of the insulating layer 132 serves as a gate insulating layer, and the conductive layers 113a and 113b serve as a source electrode and a drain electrode.

Next, the insulating layer 133 that covers the transistors 41 and 42 is formed (FIG. 11C). The insulating layer 133 can be formed in a manner similar to that of the insulating layer 131.

The insulating layer 133 is preferably formed using an oxide insulating film formed in an atmosphere containing oxygen, such as a silicon oxide film or a silicon oxynitride film. Furthermore, an insulating film with low oxygen diffusibility and low oxygen permeability, such as a silicon nitride film, is preferably stacked over the oxide insulating film. The oxide insulating film formed in an atmosphere containing oxygen can easily release a large amount of oxygen by heating. When such an oxide insulating film that releases oxygen and an insulating film with low oxygen diffusibility and low oxygen permeability are stacked and heated, oxygen can be supplied to the oxide semiconductor layer. As a result, oxygen vacancies in the oxide semiconductor layer can be filled and defects at the interface between the oxide semiconductor layer and the insulating layer 133 can be repaired, leading to a reduction in the density of defect levels. Accordingly, an extremely highly reliable display device can be fabricated.

Then, the insulating layer 134a is formed over the insulating layer 133 (FIG. 11C). The insulating layer 134a preferably serves as a planarization layer because the display element is formed on the insulating layer 134a in a later step. The insulating layer 134a can be formed using an organic insulating film or an inorganic insulating film that can be used for the insulating layer 131.

The insulating layer 134b is formed over the insulating layer 134a (FIG. 11C). The insulating layer 134b is formed selectively so as to have a convex portion. The convex portion preferably has a round top, and gently sloped side surfaces. The insulating layers 134a and 134b form the insulating layer 134. The insulating layer 134b allows the insulating layer 134 to have an uneven surface.

Next, an opening that reaches the conductive layer 113a of the transistor 41 is formed in the insulating layers 134a and 133. An opening that reaches the conductive layer 113a of the transistor 42 may also be formed at the same time.

After that, the electrode 121 is formed (FIG. 11C). The electrode 121 is formed along the surface of the insulating layer 134 and thus, has a convex-concave shape. Part of the electrode 121 serves as a pixel electrode of the light-emitting element 120. The electrode 121 can be formed in the following manner: a conductive film is formed, a resist mask is formed, the conductive film is etched, and the resist mask is removed. Here, the electrode 121 is connected to the conductive layer 113a of the transistor 41.

Then, the insulating layer 135 that covers an end portion of the electrode 121 is formed (FIG. 11C). The insulating layer 135 can be formed using an organic insulating film or an inorganic insulating film that can be used for the insulating layer 131. The insulating layer 135 includes an opening in a position that overlaps with the electrode 121. At this time, the insulating layer 135 may include an opening that reaches the conductive layer 113a of the transistor 42.

Next, the light-emitting layer 122 and the electrode 123 are formed (FIG. 11D). Part of the electrode 123 serves as a common electrode of the light-emitting element 120.

The light-emitting layer 122 can be formed by an evaporation method, a coating method, a printing method, a discharge method, or the like. In the case where the light-emitting layer 122 is formed for every pixel, an evaporation method using a shadow mask such as a metal mask, an ink-jet method, or the like can be used. In the case where the light-emitting layer 122 is shared by pixels, an evaporation method not using a metal mask can be used.

Either a low molecular compound or a high molecular compound can be used for the light-emitting layer 122, and an inorganic compound may also be included.

Steps after the formation of the light-emitting layer 122 are performed such that temperatures higher than the upper temperature limit of the light-emitting layer 122 are not applied to the light-emitting layer 122. The electrode 123 can be formed by an evaporation method, a sputtering method, or the like.

Through the above steps, the light-emitting element 120 can be formed (FIG. 11D). In the light-emitting element 120, the electrode 121 part of which serves as the pixel electrode, the light-emitting layer 122, and the electrode 123 part of which serves as the common electrode are stacked.

A top emission light-emitting element is formed as the light-emitting element 120 here; however, one embodiment of the present invention is not limited to this example.

The light-emitting element 120 may be a top emission, bottom emission, or dual emission light-emitting element. A conductive film that transmits visible light is used for the electrode through which light is extracted. A conductive film that reflects visible light is preferably used for the electrode through which light is not extracted.

Next, the insulating layer 124 is formed to cover the electrode 123 (FIG. 11D). The insulating layer 124 serves as a protective layer that prevents the diffusion of impurities such as water into the light-emitting element 120. The light-emitting element 120 is sealed with the insulating layer 124. After the electrode 123 is formed, the insulating layer 124 is preferably formed without being exposed to the air.

The insulating layer 124 preferably includes, for example, an inorganic insulating film with a high barrier property that can be used for the insulating layer 131. An inorganic insulating film and an organic insulating film may be stacked.

The substrate temperature during the deposition of the insulating layer 124 is preferably lower than or equal to the upper temperature limit of the light-emitting layer 122. The insulating layer 124 can be formed by an ALD method, a sputtering method, or the like. An ALD method and a sputtering method are preferable because a film can be formed at low temperatures. An ALD method is preferable because the coverage of the insulating layer 124 is improved.

Next, the insulating layer 125 is formed over the insulating layer 124 (FIG. 11D). The insulating layer 125 has a very flat surface and serves as a planarization film. The insulating layer 125 preferably contains an organic material.

Then, an opening that reaches the conductive layer 113a of the transistor 42 is formed in the light-emitting layer 122, the electrode 123, the insulating layer 124, and the insulating layer 125 (FIG. 11E). In the case where the opening that reaches the conductive layer 113a is not formed in the insulating layers 133, 134, and 135 in a previous step, the opening can be formed simultaneously in these layers in this step.

The opening 50 can be formed in the light-emitting layer 122, the electrode 123, the insulating layer 124, and the insulating layer 125 by etching using a resist mask 127.

Here, the light-emitting layer 122 is exposed by the formation of the opening 50. This might cause impurities to enter the light-emitting layer 122 or the light-emitting layer 122 to disappear in the removing step of the resist mask 127. Specifically, for example, impurities might enter the light-emitting layer 122 or the light-emitting layer 122 might be dissolved with plasma treatment or a resist stripper for removing the resist mask 127.

Hence, the opening 50 is preferably formed by dry etching. In that case, a partition 126 is sometimes formed on the side surfaces of the opening 50 with an etching gas (FIG. 11E). For example, the use of an etching gas containing carbon and fluorine enables a by-product to be deposited on the side surfaces of the opening 50, so that the partition 126 is formed.

Figure 12A:
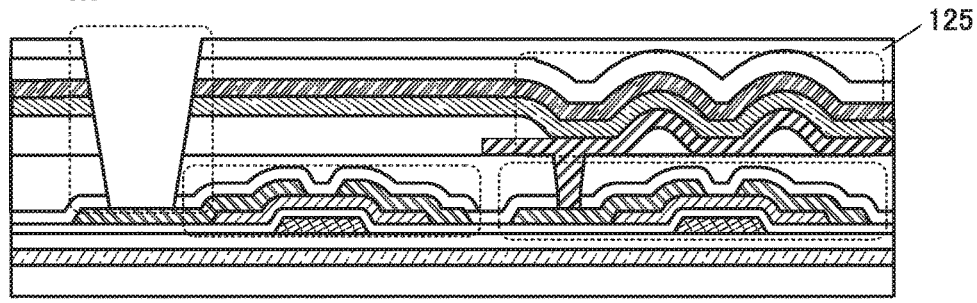
FIGS. 12A to 12D illustrate an example of the method for manufacturing the display device.

After that, the resist mask 127 is removed (FIG. 12A). The partition 126 protects the light-emitting layer 122 when the resist mask 127 is removed, resulting in improved reliability of the light-emitting element 120. Note that the removal of the resist mask 127 causes the partition 126 to be removed partly or entirely in some cases. FIG. 12A illustrates the case where the partition 126 does not remain.

Figure 12B:
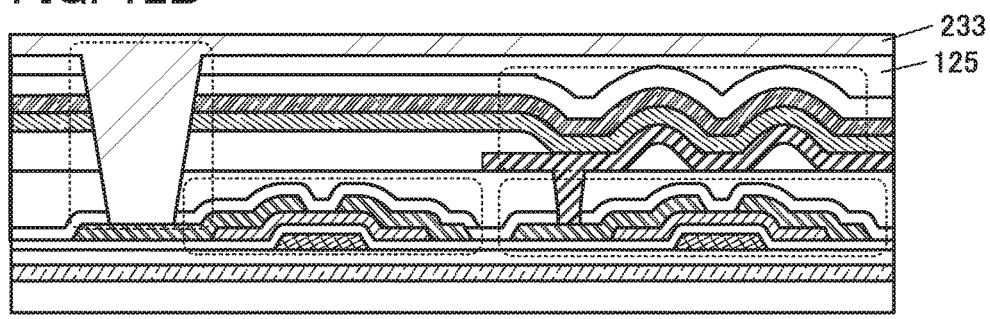
Figure 12C:
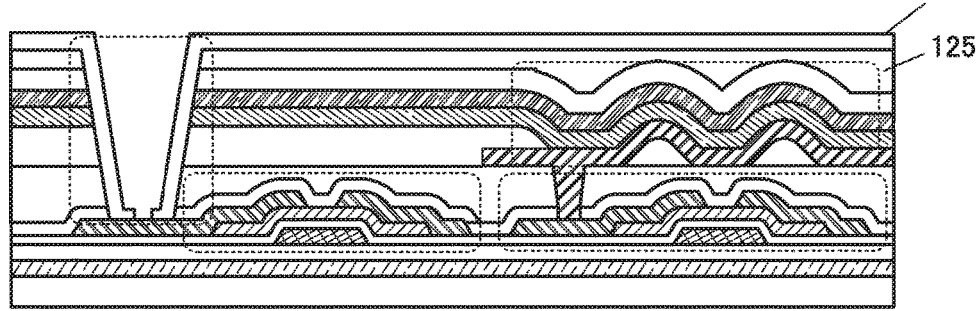

Then, an insulating layer 234 including the opening 50 that reaches the conductive layer 113a of the transistor 42 is formed. Here, a film of a photosensitive material 233 is formed and subjected to a lithography step using light, so that the insulating layer 234 including the opening 50 is formed (FIGS. 12B and 12C).

Specifically, a film of the photosensitive material 233 is formed and exposed to light using a photomask. Development treatment is performed subsequently, so that an unnecessary portion is removed.

The insulating layer 234 is formed so as to cover the side surface of the light-emitting layer 122 that is exposed in the opening 50. The insulating layer 234 is also formed so as to cover the side surface of the electrode 123 that is exposed in the opening 50. This can electrically insulate the electrode 123 from the electrode 221 to be formed later, which prevents a short-circuit.

The substrate temperature during the deposition of the insulating layer 234 is preferably lower than or equal to the upper temperature limit of the light-emitting layer 122.

Note that in the case where an inorganic material is used for the insulating layer 234, a material and a manufacturing method similar to those of the insulating layer 125 are preferably used.

The insulating layer 234 has an opening at the bottom of the opening 50.

Figure 12D:
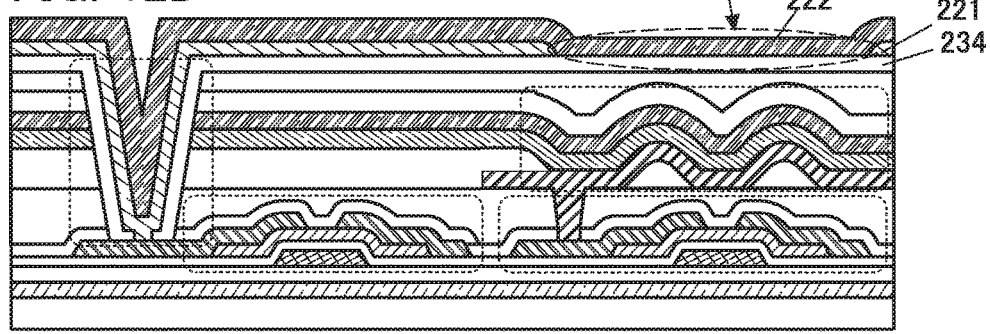

Then, the electrode 221 is formed (FIG. 12D). Part of the electrode 221 serves as a pixel electrode of the liquid crystal element 220. The electrode 221 has the opening 36 in a region that overlaps with the light-emitting element 120. Such an electrode 221 can be formed in the following manner: a conductive film is formed, a resist mask is formed, the conductive film is etched, and the resist mask is removed. Here, the electrode 221 is electrically connected to the conductive layer 113a of the transistor 42.

The electrode 222 is formed over the electrode 221. The electrode 222 is provided also in a region overlapping with the opening 36 so that the liquid crystal layer over the opening 36 can be controlled.

Figure 13A:
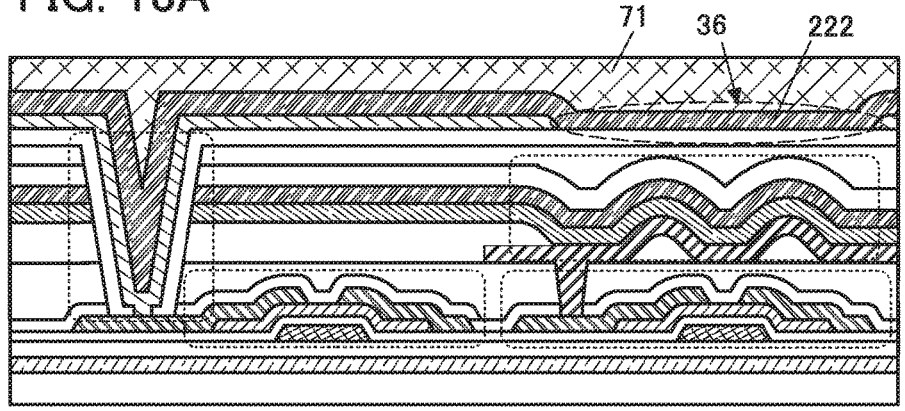
FIGS. 13A to 13C illustrate an example of the method for manufacturing the display device.

Then, a protective layer 71 is formed as illustrated in FIG. 13A.

The protective layer 71 has a function of protecting surfaces of the insulating layer 234 and the electrode 222 in a separation step. The protective layer 71 can be formed using a material that can be easily removed.

For the protective layer 71 that can be removed, a water-soluble resin can be used, for example. A water-soluble resin is applied to an uneven surface to cover the unevenness, which facilitates the protection of the surface.

As the protective layer 71 that can be removed, an adhesive that can be separated by light or heat may be stacked over a water-soluble resin.

For the protective layer 71 that can be removed, a base material having a property in which adhesion is strong in a normal state but weakened when irradiated with light or heated may be used. For example, a thermal separation tape whose adhesion is weakened by heat or a UV-separation tape whose adhesion is weakened by ultraviolet irradiation may be used. Alternatively, a weak adhesion tape with weak adhesiveness in a normal state, or the like can be used. Further alternatively, optical clear adhesive (OCA), silicone, or the like can be used. Note that the protective layer 71 does not necessarily transmit visible light.

Figure 13B:
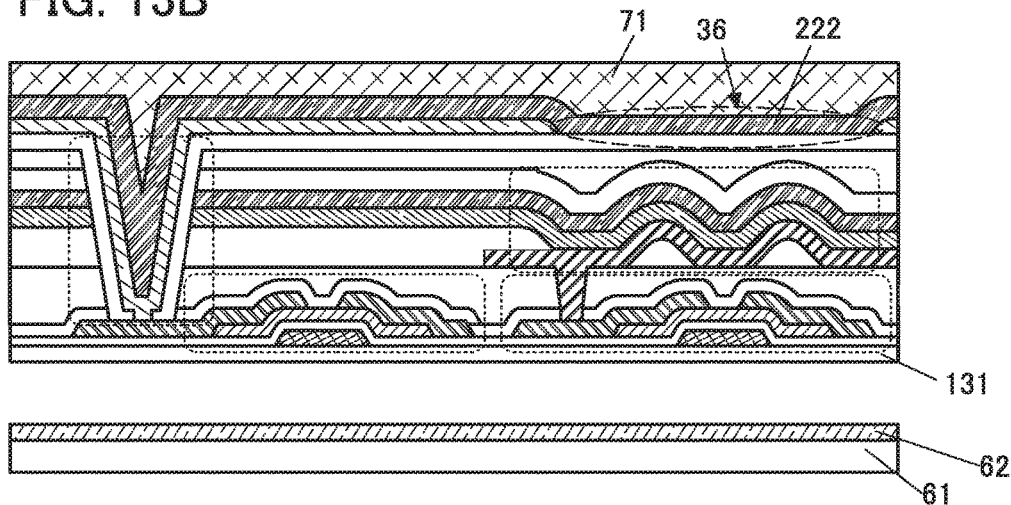

Next, the substrate 61 and the insulating layer 131 are separated from each other (FIG. 13B).

The position of the separation surface depends on the materials, the formation methods, and the like of the separation layer 62, the substrate 61, and the like.

FIG. 13B illustrates an example where the separation occurs at the interface between the separation layer 62 and the insulating layer 131. By the separation, the insulating layer 131 is exposed.

Before the separation, a separation trigger may be formed in the separation layer 62. For example, by laser irradiation, the separation layer 62 can be embrittled or adhesion between the separation layer 62 and the insulating layer 131 (or the substrate 61) can be reduced.

The substrate 61 can be separated by applying a perpendicular tensile force to the separation layer 62, for example. Specifically, part of the top surface of the protective layer 71 is adsorbed and pulled upward, whereby the substrate 61 can be separated.

The separation trigger may be formed by inserting a sharp instrument such as a knife between the separation layer 62 and the insulating layer 131. Alternatively, the separation trigger may be formed by cutting the separation layer 62 from the protective layer 71 side with a sharp instrument.

Figure 13C:
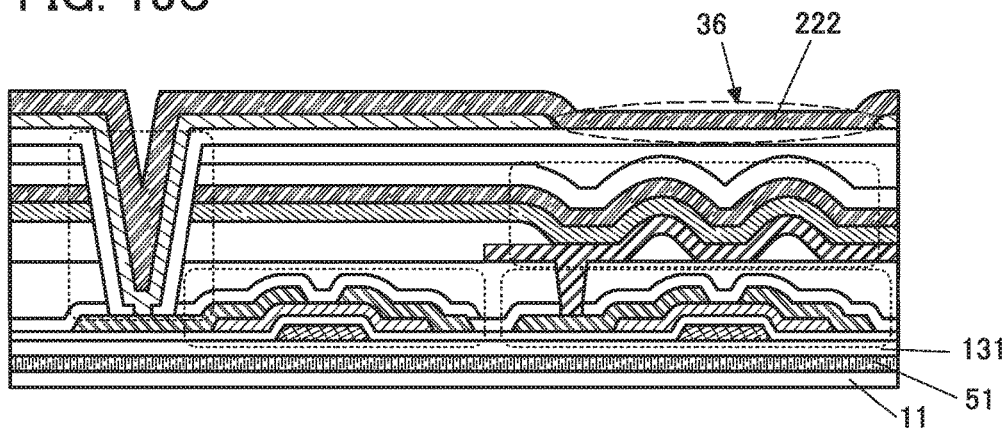

Then, the substrate 11 is bonded to an exposed surface of the insulating layer 131 with an adhesive layer 51 (FIG. 13C). The substrate 11 can serve as a supporting substrate of the display device. Then, the protective layer 71 is removed (FIG. 13C).

For the adhesive layer 51, any of a variety of curable adhesives such as a reactive curable adhesive, a thermosetting adhesive, an anaerobic adhesive, and a photocurable adhesive such as an ultraviolet curable adhesive can be used. Alternatively, an adhesive sheet or the like may be used.

For the substrate 11, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 11 may be formed using any of a variety of materials such as glass, quartz, a resin, a metal, an alloy, and a semiconductor, each of which is thin enough to be flexible.

Figure 14A:
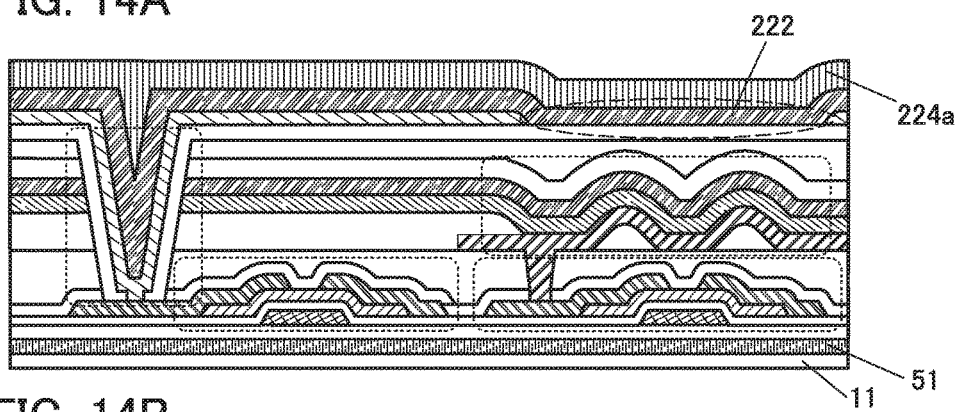
FIGS. 14A and 14B illustrate an example of the method for manufacturing the display device.

Then, the alignment film 224a is formed over the electrode 222 (FIG. 14A). The alignment film 224a can be formed in such a manner that a thin film of a resin or the like is formed and then subjected to rubbing treatment.

Figure 14B:
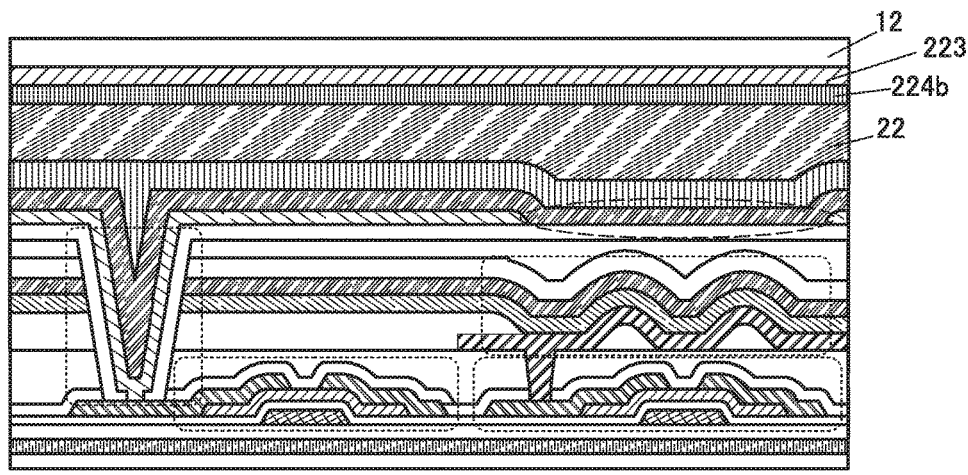

Then, the substrate 12 and the substrate 11 are attached to each other with the liquid crystal layer 22 provided therebetween (FIG. 14B).

Note that in advance, the electrode 223 is formed on the substrate 12 and the alignment film 224b is formed on the electrode 223. The electrode 223 can be formed in the following manner: a conductive film is formed, a resist mask is formed, the conductive film is etched, and the resist mask is removed. The alignment film 224b can be formed in such a manner that a thin film of a resin or the like is formed and then subjected to rubbing treatment. The substrate 12 is preferably formed using a material similar to that of the substrate 11.

Through the above steps, the display device 10A can be manufactured (FIG. 14B). The thickness or the weight of the display device 10A can be reduced. The display device 10A can be kept in a bent state or repeatedly bent, for example.

Figure 3:
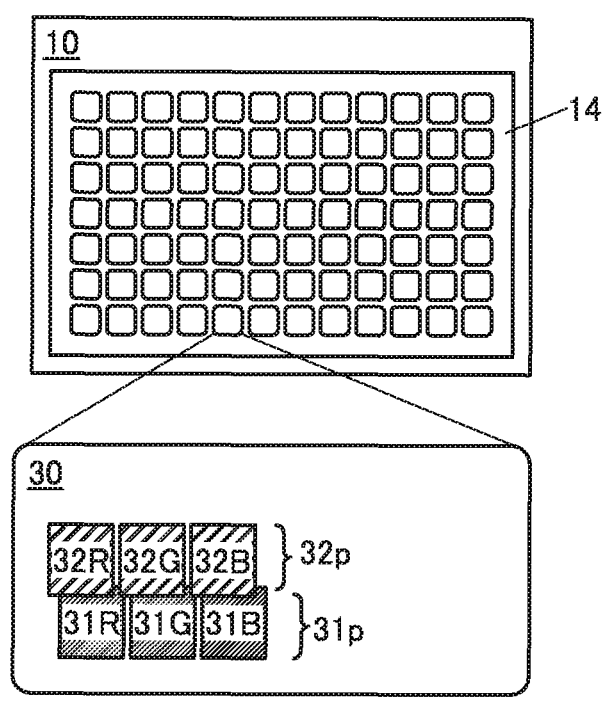
FIG. 3 illustrates an example of the display device.

FIG. 3 is a block diagram of the display device 10. The display device 10 includes a display portion 14.

The display portion 14 includes a plurality of pixels arranged in a matrix. The pixels 30 each include a first pixel 31p and a second pixel 32p. The second pixel 32p overlaps with the first pixel 31p.

Display elements included in the first pixel 31p are light-emitting elements. For example, the first display element 31 illustrated in FIGS. 1A and 1B is provided in the first pixel 31p. The first pixel 31p includes a first red display element 31R corresponding to red (R), a first green display element 31G corresponding to green (G), and a first blue display element 31B corresponding to blue (B), so that color display is performed. The first red display element 31R, the first green display element 31G, and the first blue display element 31B can be obtained when different light-emitting materials are used for the light-emitting layers 122 or different organic materials are used for the coloring layer 225.

Display elements included in the second pixel 32p are liquid crystal elements. For example, the second display element 32 illustrated in FIGS. 1A and 1B is provided in the second pixel 32p. The second pixel 32p includes a second red display element 32R corresponding to red (R), a second green display element 32G corresponding to green (G), and a second blue display element 32B corresponding to blue (B), so that color display is performed. The second red display element 32R, the second green display element 32G, and the second blue display element 32B can be obtained when coloring layers such as color filters are provided in the second display element 32.

The second red display element 32R is positioned above the first red display element 31R. The second green display element 32G is positioned above the first green display element 31G. The second blue display element 32B is positioned above the first blue display element 31B.

Figure 4A:
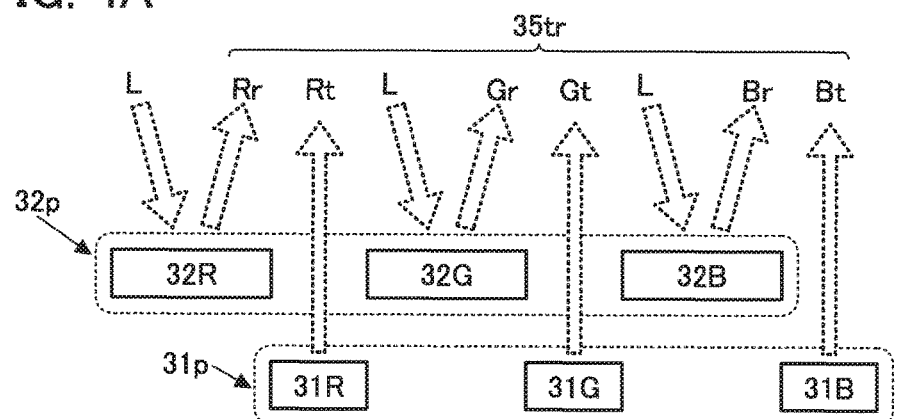
FIGS. 4A to 4C illustrate examples of the display device.
Figure 4B:
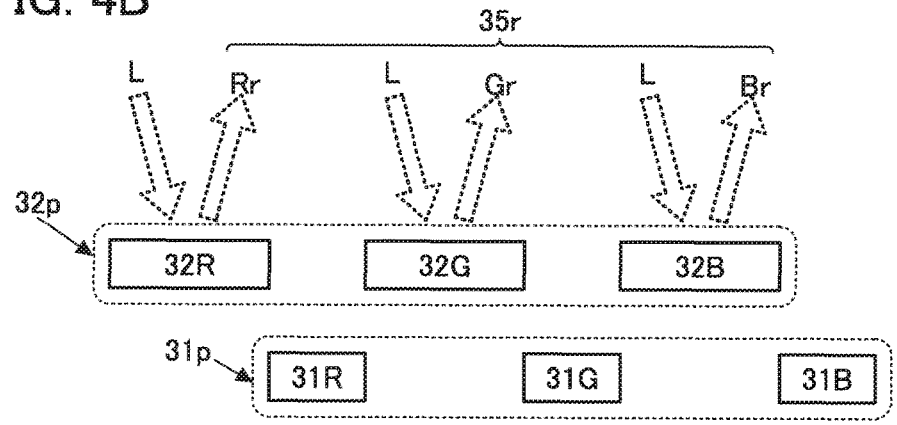
Figure 4C:
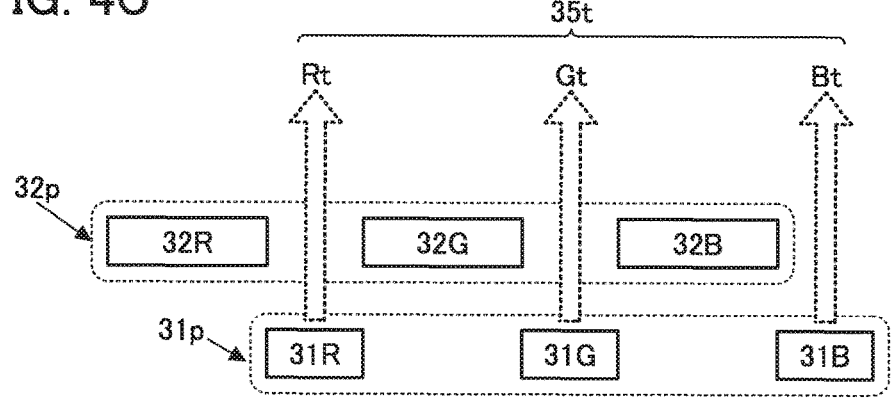

FIGS. 4A to 4C are schematic diagrams illustrating structure examples of the pixel 30.

FIG. 4A corresponds to a display mode (a first mode) in which both the first pixel 31p and the second pixel 32p are driven.

The first red display element 31R, the first green display element 31G, and the first blue display element 31B included in the first pixel 31p emit light to the display surface side. Red light Rt is emitted from the first red display element 31R, green light Gt is emitted from the first green display element 31G, and blue light Bt is emitted from the first blue display element 31B.

The second red display element 32R, the second green display element 32G, and the second blue display element 32B included in the second pixel 32p reflect external light L and emit the reflected light to the display surface side. The second red display element 32R reflects the external light L and emits red light Rr to the display surface side, the second green display element 32G reflects the external light L and emits green light Gr to the display surface side, and the second blue display element 32B reflects the external light L and emits blue light Br to the display surface side.

Light 35tr of a predetermined color can be emitted to the display surface side with use of the transmitted light (the light Rt, the light Gt, and the light Bt) and the reflected light (the light Rr, the light Gr, and the light Br).

FIG. 4B corresponds to a display mode (a second mode) using reflected light in which only the second pixel 32p is driven. For example, when the intensity of external light is high enough, the pixel 30 can emit light 35r to the display surface side using only the light from the second pixel 32p (the light Rr, the light Gr, and the light Br), without driving the first pixel 31p. This mode is suitable for displaying information that need not be displayed in color such as text information. That is, the second mode is preferable for low-power driving and contributes to a reduction in the power consumption of the display device.

FIG. 4C corresponds to a display mode (a third mode) using transmitted light (emitted light) in which only the first pixel 31p is driven. For example, when the intensity of external light is low, the pixel 30 can emit light 35t to the display surface side using only the light from the first pixel 31p (the light Rt, the light Gt, and the light Bt). At this time, the transistor 41 can control the electrode 121 illustrated in FIGS. 1A and 1B and the like, and a vivid image can be displayed accordingly. Furthermore, by lowering the luminance in a dark environment, a user can be prevented from feeling glare and power consumption can be reduced. A display device with high visibility can be provided regardless of the ambient brightness.

FIGS. 5A to 5C and FIGS. 6A to 6C each illustrate a structure example of the pixel 30, which is different from that in FIG. 4A. Although FIGS. 5A to 5C and FIGS. 6A to 6C are schematic diagrams corresponding to the display mode (the first mode) in which both the first pixel 31p and the second pixel 32p are driven, display can also be performed in the mode (the third mode or the second mode) in which only the first pixel 31p or the second pixel 32p is driven like in FIGS. 4B and 4C.

First, description is made on the first pixel 31p. The first pixel 31p illustrated in FIGS. 5A, 5C, and 6B includes a first white display element 31W emitting white (W) light in addition to the first red display element 31R, the first green display element 31G, and the first blue display element 31B.

Figure 5A:
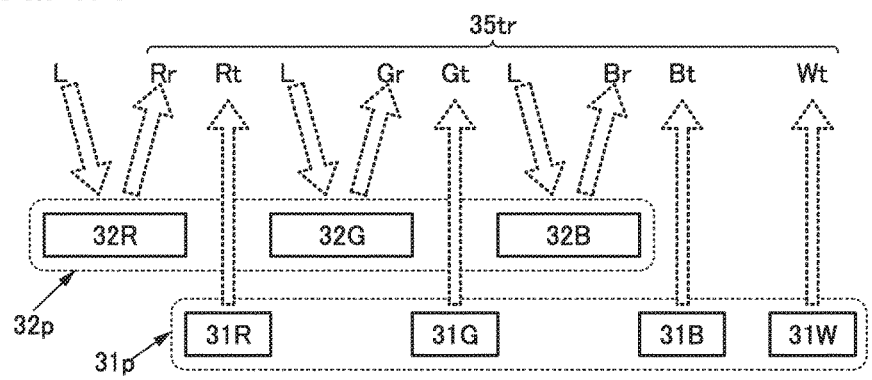
FIGS. 5A to 5C illustrate examples of the display device.
Figure 5B:
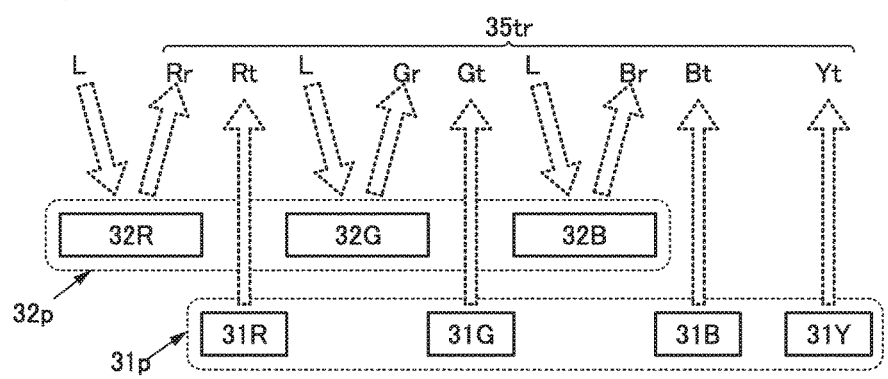
Figure 6A:
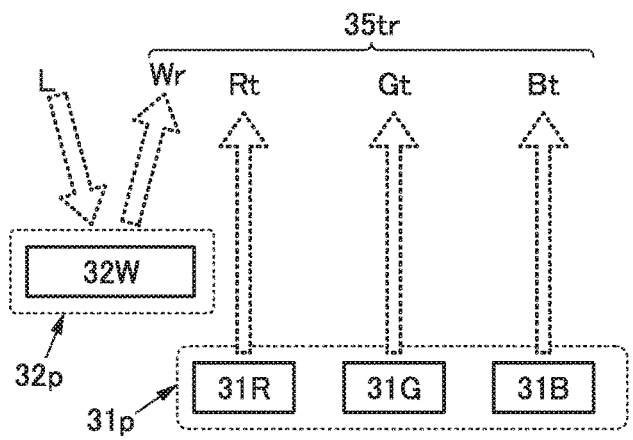
FIGS. 6A to 6C illustrate examples of the display device.
Figure 6B:
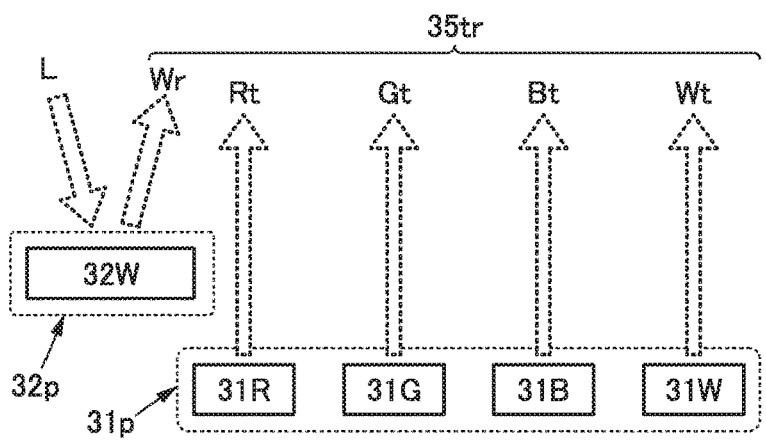
Figure 6C:
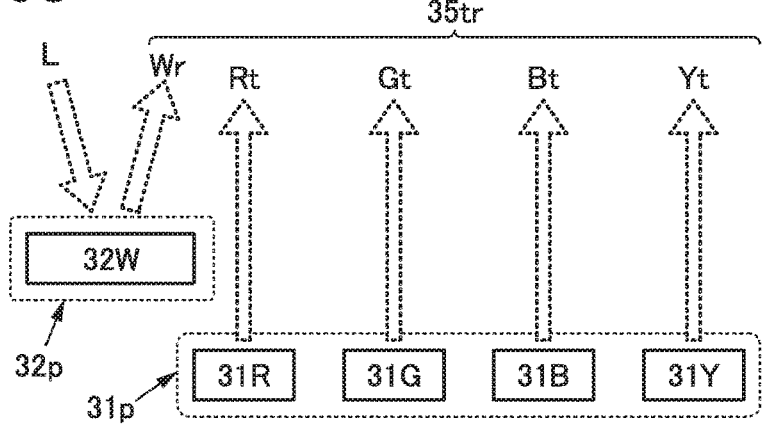

The first pixel 31p illustrated in FIGS. 5B and 6C includes a first yellow display element 31Y emitting yellow (Y) light in addition to the first red display element 31R, the first green display element 31G, and the first blue display element 31B.

The power consumption in the display mode using the first pixel 31p (the first mode and the third mode) can be lower in the structures illustrated in FIGS. 5A to 5C and FIGS. 6B and 6C than in the structure not including the first white display element 31W and the first yellow display element 31Y.

Description is made on the second pixel 32p. The second pixel 32p illustrated in FIG. 5C includes a second white display element 32W emitting white (W) light in addition to the second red display element 32R, the second green display element 32G, and the second blue display element 32B.

Figure 5C:
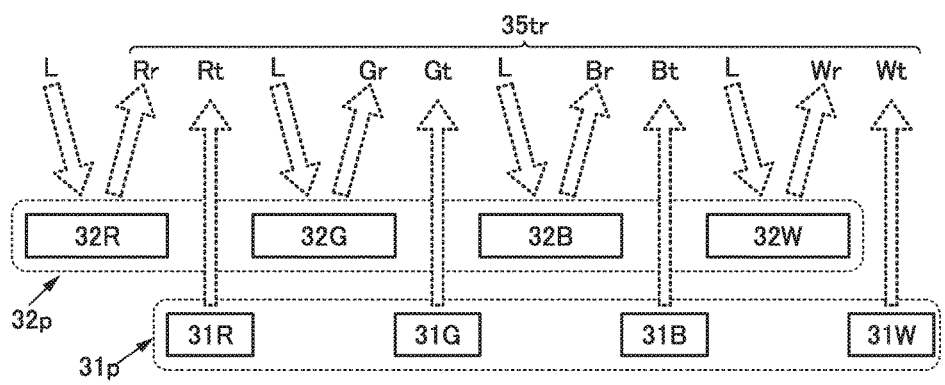

The power consumption in the display mode using the second pixel 32p (the second mode and the first mode) can be lower in the structure illustrated in FIG. 5C than in the structure illustrated in FIG. 4A.

The second pixel 32p illustrated in FIGS. 6A to 6C includes only the second white display element 32W emitting white light. In this structure, a black-and-white image or a grayscale image can be displayed in the display mode (the second mode) using only the second pixel 32p, and a color image can be displayed in the display mode (the first mode and the third mode) using the first pixel 31p.

This structure can increase the reflectivity of the second pixel 32p, and a brighter image can be displayed accordingly.

The display device of this embodiment includes two types of display elements as described above; thus, switching between a plurality of display modes is possible. Accordingly, the display device can have high convenience and high visibility regardless of the ambient brightness. In addition, the transistors driving the two display elements can be formed on the same plane in the same process, reducing the thickness of the display device and simplifying the manufacturing process.

This embodiment can be combined with any of the other embodiments as appropriate.

Embodiment 2

In this embodiment, a structure example of the display device described in Embodiment 1 will be described in more detail with reference to FIG. 15A to FIG. 18B.

The display device described in this embodiment includes a reflective liquid crystal element and a light-emitting element and can perform display both in a transmissive mode and in a reflective mode.

Figure 15A:
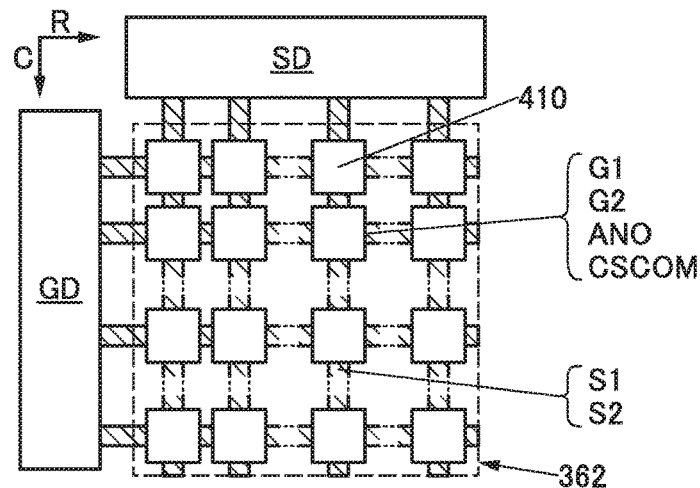
Figure 15A:
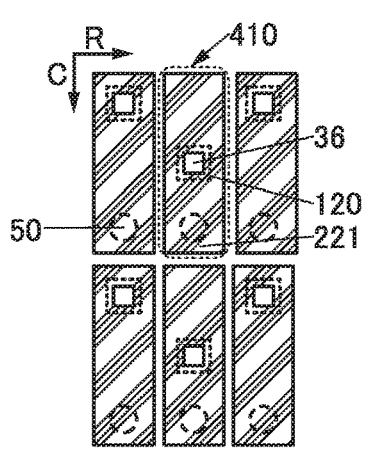
Figure 15A:
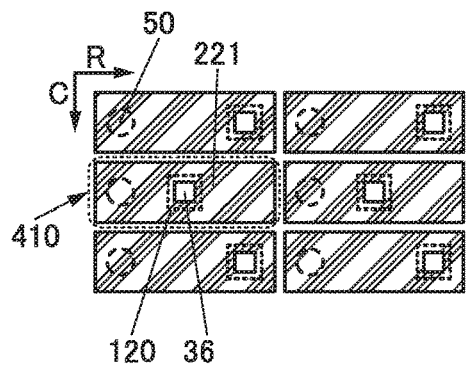
Figure 15A:
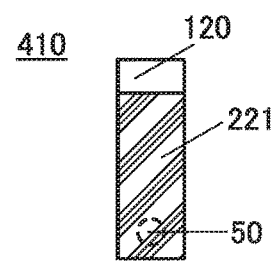

FIG. 15A is a block diagram of a display device 400. The display device 400 includes a display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings 51, and a plurality of wirings S2. The plurality of wirings G1, the plurality of wirings G2, the plurality of wirings ANO, and the plurality of wirings CSCOM are each electrically connected to the circuit GD and the plurality of pixels 410 arranged in a direction indicated by an arrow R. The plurality of wirings 51 and the plurality of wirings S2 are each electrically connected to the circuit SD and the plurality of pixels 410 arranged in a direction indicated by an arrow C.

Although the structure including one circuit GD and one circuit SD is illustrated here for simplicity, the circuit GD and the circuit SD for driving liquid crystal elements and the circuit GD and the circuit SD for driving light-emitting elements may be provided separately.

The pixel 410 includes a reflective liquid crystal element and a light-emitting element.

FIGS. 15B1, 15B2, and 15B3 illustrate structure examples of the electrode 221 included in the pixel 410. The electrode 221 serves as a reflective electrode of the liquid crystal element. The opening 36 is provided in the electrode 221 in FIGS. 15B1 and 15B2. The opening 50, through which the liquid crystal element is electrically connected to the transistor, is provided in a position that does not overlap with the opening 36 and the light-emitting element 120.

In FIGS. 15B1 and 15B2, the light-emitting element 120 positioned in a region that overlaps with the electrode 221 is indicated by a broken line. The light-emitting element 120 overlaps with the opening 36 included in the electrode 221. Thus, light from the light-emitting element 120 is emitted to the display surface side through the opening 36.

In FIG. 15B1, the pixels 410 which are adjacent in the direction indicated by the arrow R emit light of different colors. As illustrated in FIG. 15B1, the openings 36 are preferably provided in different positions in the electrodes 221 so as not to be aligned in two adjacent pixels provided in the direction indicated by the arrow R. This allows two light-emitting elements 120 to be apart from each other, thereby preventing light emitted from the light-emitting element 120 from entering a coloring layer in the adjacent pixel 410 (such a phenomenon is referred to as crosstalk). Furthermore, since two adjacent light-emitting elements 120 can be arranged apart from each other, a high-resolution display device is achieved even when light-emitting layers of the light-emitting elements 120 are separately formed with a shadow mask or the like.

In FIG. 15B2, the pixels 410 which are adjacent in a direction indicated by the arrow C emit light of different colors. Also in FIG. 15B2, the openings 36 are preferably provided in different positions in the electrodes 221 so as not to be aligned in two adjacent pixels provided in the direction indicated by the arrow C.

The smaller the ratio of the total area of the opening 36 to the total area except for the opening is, the brighter an image displayed using the liquid crystal element can be. Furthermore, the larger the ratio of the total area of the opening 36 to the total area except for the opening is, the brighter an image displayed using the light-emitting element 120 can be. The light-emitting element 120 includes the light-emitting layer having a convex-concave shape, and therefore, has a high light extraction efficiency and a long lifetime.

The opening 36 may have a polygonal shape, a quadrangular shape, an elliptical shape, a circular shape, a cross-like shape, a stripe shape, a slit-like shape, or a checkered pattern, for example. The opening 36 may be provided close to an adjacent pixel. Preferably, the opening 36 is provided close to another pixel that emits light of the same color, in which case crosstalk can be suppressed.

As illustrated in FIG. 15B3, a light-emitting region of the light-emitting element 120 may be positioned in a region where the electrode 221 is not provided, in which case light emitted from the light-emitting element 120 is emitted to the display surface side.

As the circuit GD, any of a variety of sequential circuits such as a shift register can be used. In the circuit GD, a transistor, a capacitor, and the like can be used. A transistor included in the circuit GD can be formed in the same steps as the transistors included in the pixels 410.

The circuit SD is electrically connected to the wirings 51. For example, an integrated circuit can be used as the circuit SD. Specifically, an integrated circuit formed on a silicon substrate can be used as the circuit SD.

For example, a chip on glass (COG) method, a chip on film (COF) method, or the like can be used to mount the circuit SD on a pad electrically connected to the pixels 410. Specifically, an anisotropic conductive film can be used to mount an integrated circuit on the pad.

Figure 16:
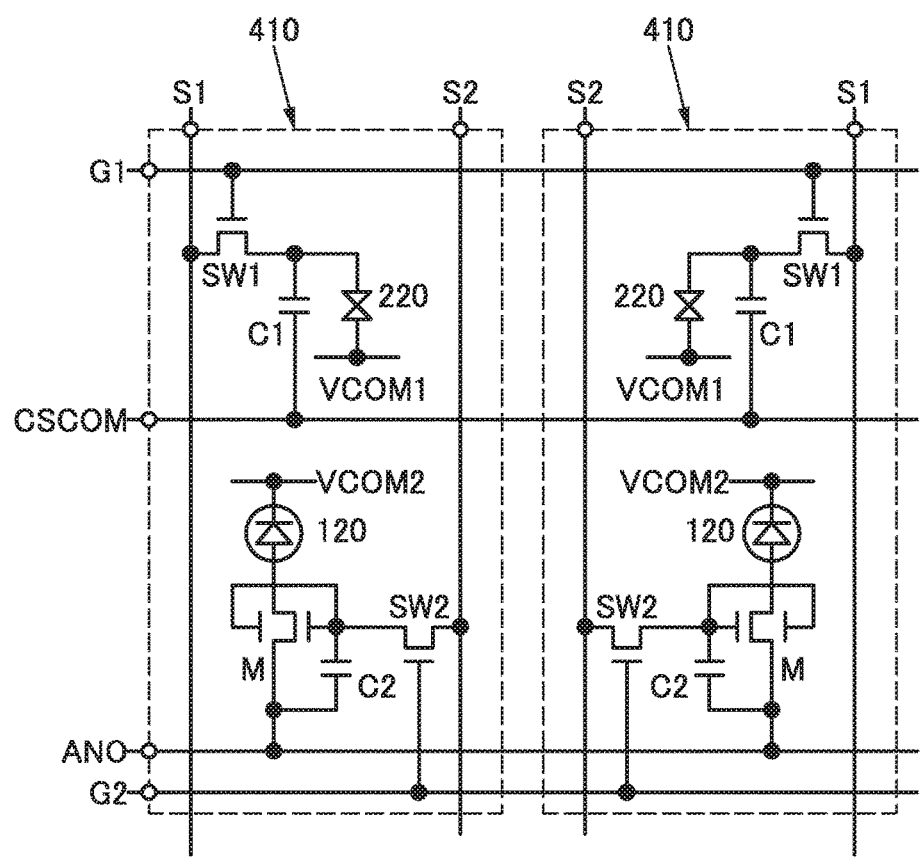
FIG. 16 illustrates an example of the display device.

FIG. 16 is an example of a circuit diagram of the pixels 410. FIG. 16 shows two adjacent pixels 410.

The pixels 410 each include a switch SW2, a transistor M, a capacitor C2, the light-emitting element 120, and the like as the first display element, and include a switch SW1, a capacitor C1, the liquid crystal element 220, and the like as the second display element. The pixel 410 is electrically connected to the wiring G1, the wiring G2, the wiring ANO, the wiring CSCOM, the wiring S1, and the wiring S2. The wirings S1 and S2 serve as signal lines whereas the wirings G1 and G2 serve as scan lines. In the pixel 410, the switches are not shared and can supply appropriate signal voltages to the respective signal lines. In the case where a switch is shared, a signal line is also shared, which prevents a voltage supplied to the signal line from having a small value because a signal voltage for the liquid crystal element and a signal voltage for the light-emitting element are supplied to the signal line.

FIG. 16 illustrates a wiring VCOM1 electrically connected to the liquid crystal element 220 and a wiring VCOM2 electrically connected to the light-emitting element 120.

Since the pixel 410 includes the switch SW1 for the liquid crystal element 220 and the switch SW2 for the light-emitting element 120 as described above, the pixel 410 can be driven in the first mode to the third mode. In the first mode, for example, voltage may be applied to the electrode 222 illustrated in FIGS. 1A and 1B to control the liquid crystal layer 22.

FIG. 16 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 220. The other electrode of the capacitor C1 is connected to the wiring CSCOM. The other electrode of the liquid crystal element 220 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 120. The other electrode of the light-emitting element 120 is connected to the wiring VCOM2.

FIG. 16 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals in the liquid crystal element 220. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 120 emit light. The wiring S2 can be supplied with a signal for changing the conduction state of the transistor M.

In the pixel 410 of FIG. 16, for example, an image can be displayed in the reflective mode by driving the pixel with the signals supplied to the wiring G1 and the wiring S1 and utilizing the optical modulation of the liquid crystal element 220. In the case where an image is displayed in the transmissive mode, the pixel is driven with the signals supplied to the wiring G2 and the wiring S2 and the light-emitting element 120 emits light. In the case where both modes are performed at the same time, the pixel can be driven with the signals supplied to the wiring G1, the wiring G2, the wiring S1, and the wiring S2.

Figure 17A:
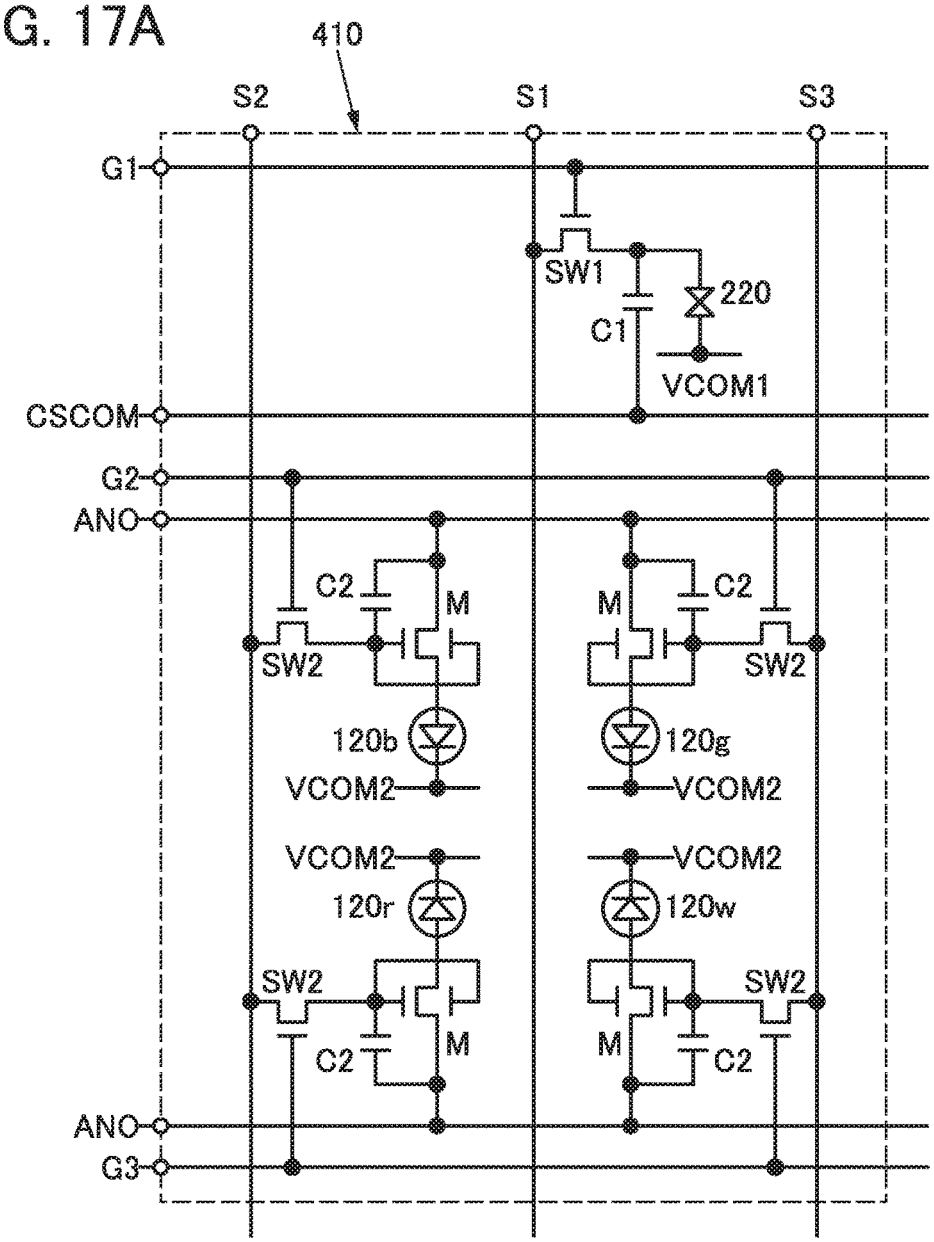
FIGS. 17A and 17B illustrate an example of the display device.

In FIG. 16, one pixel 410 includes one liquid crystal element 220 and one light-emitting element 120; however, one embodiment of the present invention is not limited to this example. FIG. 17A illustrates an example in which one pixel 410 includes one liquid crystal element 220 and four light-emitting elements 120 (light-emitting elements 120r, 120g, 120b, and 120w). The pixel 410 illustrated in FIG. 17A differs from that in FIG. 16 in being capable of performing full-color display with the use of the light-emitting elements in one pixel.

In FIG. 17A, in addition to the wirings in FIG. 16, a wiring G3 and a wiring S3 are connected to the pixel 410.

In the example in FIG. 17A, light-emitting elements emitting red light (R), green light (G), blue light (B), and white light (W) can be used as the four light-emitting elements 120, for example. Furthermore, as the liquid crystal element 220, a reflective liquid crystal element emitting white light can be used. Thus, in the case of performing display in the reflective mode, white display with high reflectivity can be performed. In the case of performing display in the transmissive mode, an image can be displayed with a higher color rendering property at low power consumption.

Figure 17B:
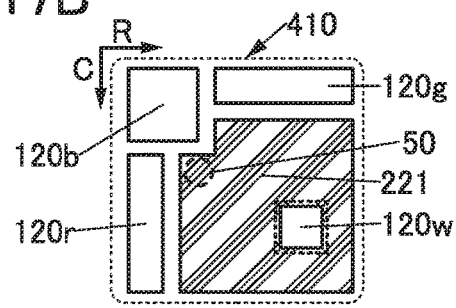

FIG. 17B illustrates a structure example of the pixel 410 corresponding to FIG. 17A. The pixel 410 includes the light-emitting element 120w overlapping with the opening included in the electrode 221 and the light-emitting elements 120r, 120g, and 120b which are arranged in the periphery of the electrode 221. It is preferable that the light-emitting elements 120r, 120g, and 120b have almost the same light-emitting area. The opening 50, through which the liquid crystal element is electrically connected to the transistor for driving the liquid crystal element, is provided in a position that does not overlap with the light-emitting element.

Figure 18A:
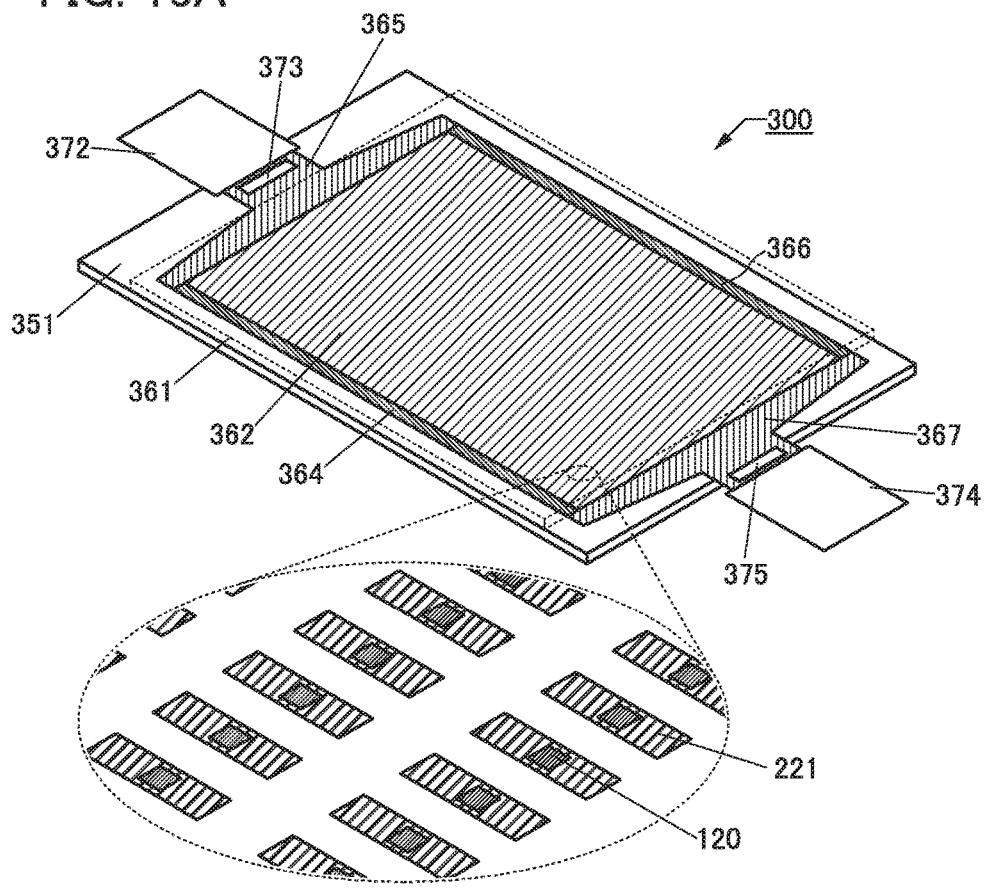
FIGS. 18A and 18B illustrate examples of a display device.
Figure 18B:
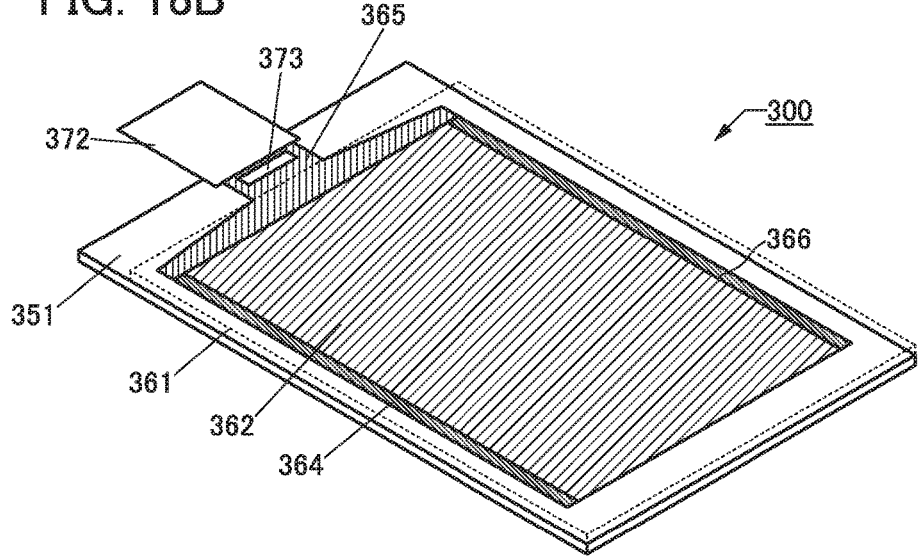

FIGS. 18A and 18B are schematic perspective views of a display device 300. In the display device 300, a substrate 351 and a substrate 361 are bonded to each other. In FIGS. 18A and 18B, the substrate 361 is denoted by a dashed line.

The display device 300 includes a display portion 362, a circuit 364, a wiring 365, a circuit 366, a wiring 367, and the like. The substrate 351 is provided with, for example, the circuit 364, the wiring 365, the circuit 366, the wiring 367, and the electrode 221 serving as a pixel electrode. In the example illustrated in FIG. 18A, an integrated circuit (IC) 373, a flexible printed circuit (FPC) 372, an IC 375, and an FPC 374 are mounted on the substrate 351. In the example illustrated in FIG. 18B, the IC 373 and the FPC 372 are mounted on the substrate 351. Thus, the structures illustrated in FIGS. 18A and 18B can each be regarded as a display module including the display device 300, the IC, and the FPC.

As the circuit 364, for example, a scan line driver circuit can be used.

The wiring 365 has a function of supplying a signal and electric power to the display portion 362 and the circuit 364. The signal and the electric power are input to the wiring 365 from the outside through the FPC 372 or from the IC 373.

An IC including a scan line driver circuit, a signal line driver circuit, or the like can be used as the IC 373 and the IC 375, for example. Note that the display device 300 and the display module are not necessarily provided with an IC. The IC may be provided over the FPC by a COF method or the like.

FIG. 18A illustrates an enlarged view of part of the display portion 362. The electrodes 221 included in a plurality of display elements are arranged in a matrix in the display portion 362. The electrode 221 has a function of reflecting visible light, and serves as a reflective electrode of the liquid crystal element 220.

As illustrated in FIG. 18A, the electrode 221 includes an opening. In addition, the light-emitting element 120 is positioned closer to the substrate 351 than the electrode 221 is. Light from the light-emitting element 120 is emitted to the substrate 361 side through the opening in the electrode 221.

This embodiment can be combined with any of the other embodiments as appropriate.

Embodiment 3

In this embodiment, a display module and electronic devices of embodiments of the present invention will be described.

Figure 19:
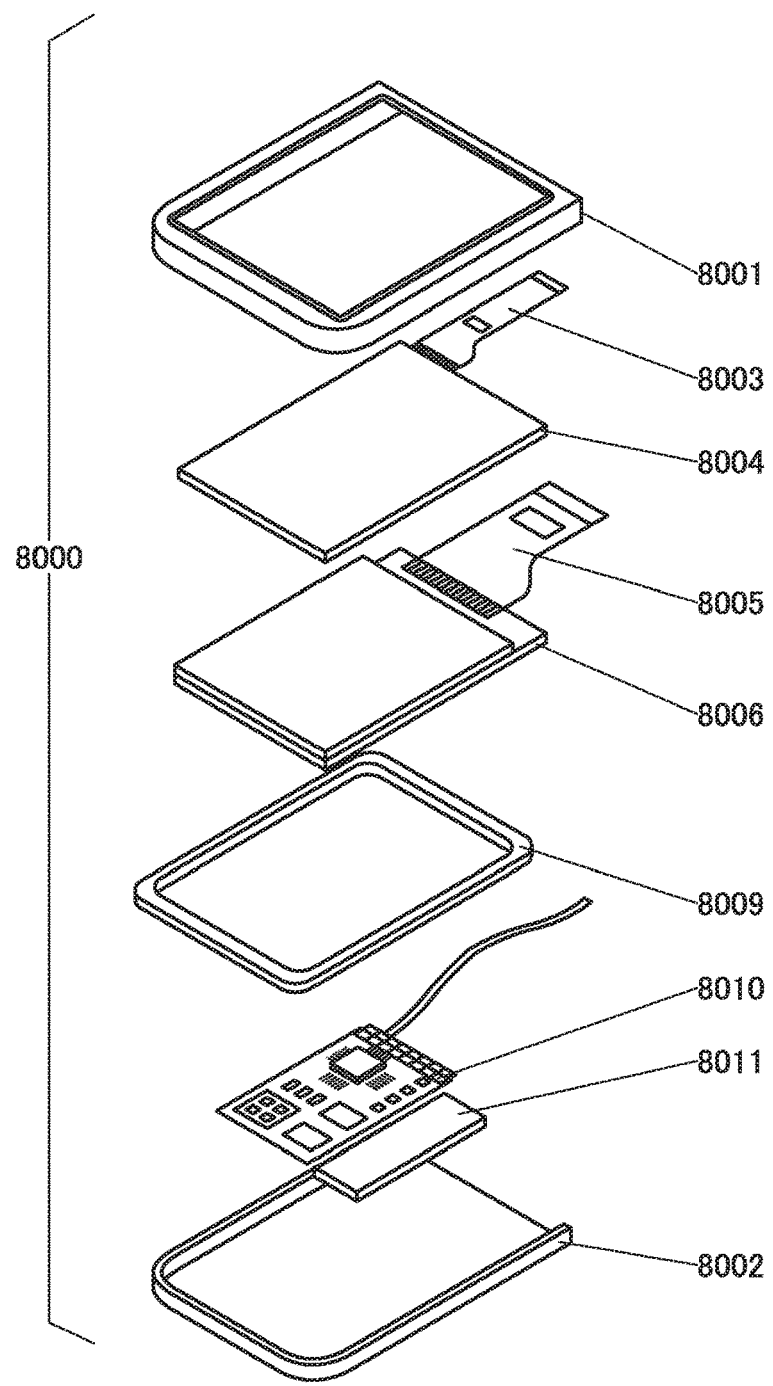
FIG. 19 illustrates an example of a display device.

In a display module 8000 in FIG. 19, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device of one embodiment of the present invention can be used for, for example, the display panel 8006.

The shape and size of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. Instead of providing the touch panel 8004, the display panel 8006 can have a touch panel function.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case where a commercial power source is used.

The display module 8000 may be additionally provided with a member such as a polarizing plate, a retardation plate, or a prism sheet.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 20A:
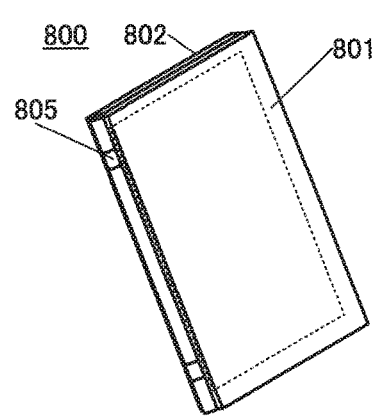
FIGS. 20A to 20D illustrate examples of a display device.
Figure 20B:
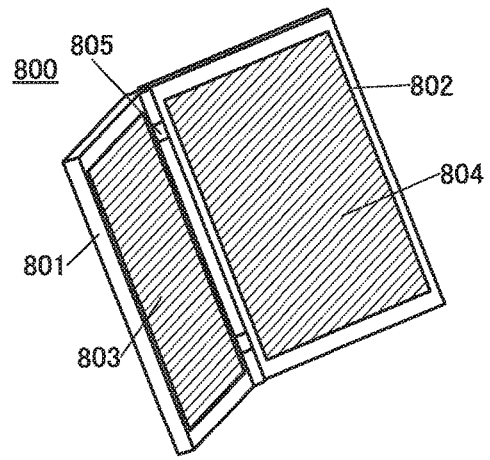

A portable information terminal 800 illustrated in FIGS. 20A and 20B includes a housing 801, a housing 802, a display portion 803, a display portion 804, a hinge portion 805, and the like.

The housing 801 and the housing 802 are joined together with the hinge portion 805. The portable information terminal 800 can be opened as illustrated in FIG. 20B from a closed state (FIG. 20A).

The display device of one embodiment of the present invention can be used for at least one of the display portion 803 and the display portion 804.

The display portion 803 and the display portion 804 can each display at least one of a text, a still image, a moving image, and the like. When a text is displayed on the display portion, the portable information terminal 800 can be used as an e-book reader.

Since the portable information terminal 800 is foldable, the portable information terminal 800 has high portability and excellent versatility.

A power button, an operation button, an external connection port, a speaker, a microphone, or the like may be provided for the housing 801 and the housing 802.

Figure 20C:
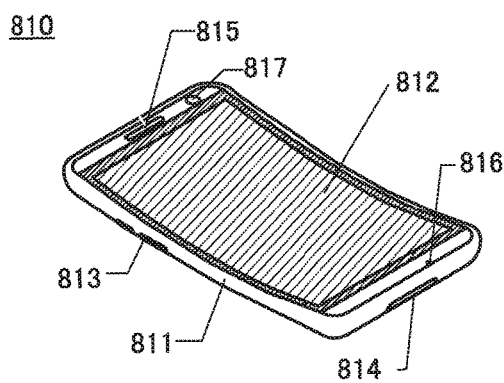

A portable information terminal 810 illustrated in FIG. 20C includes a housing 811, a display portion 812, an operation button 813, an external connection port 814, a speaker 815, a microphone 816, a camera 817, and the like.

The display device of one embodiment of the present invention can be used for the display portion 812.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications, e.g., mobile phone calls, e-mailing, viewing and editing texts, music reproduction, video replay, Internet communication, and games.

Figure 20D:
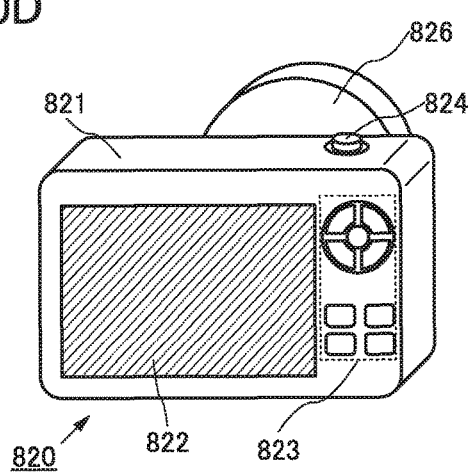

A camera 820 illustrated in FIG. 20D includes a housing 821, a display portion 822, operation buttons 823, a shutter button 824, and the like. Furthermore, an attachable lens 826 is attached to the camera 820.

The display device of one embodiment of the present invention can be used for the display portion 822.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which serves as a touch panel.

Note that a stroboscope, a viewfinder, or the like can be additionally attached to the camera 820. Alternatively, these may be incorporated into the housing 821.

FIGS. 21A to 21E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device of one embodiment of the present invention can be suitably used for the display portion 9001.

The electronic devices illustrated in FIGS. 21A to 21E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 21A to 21E are not limited to the above, and the electronic devices may have other functions.

Figure 21A:
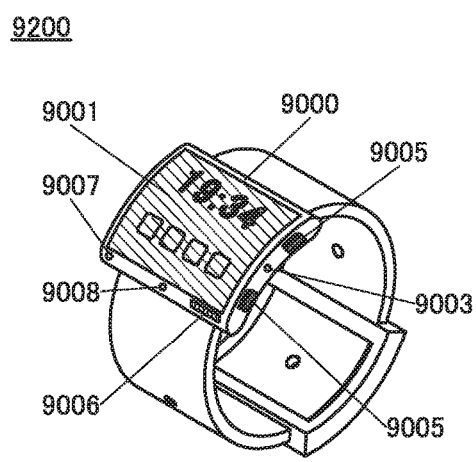
FIGS. 21A to 21E illustrate examples of a display device.
Figure 21B:
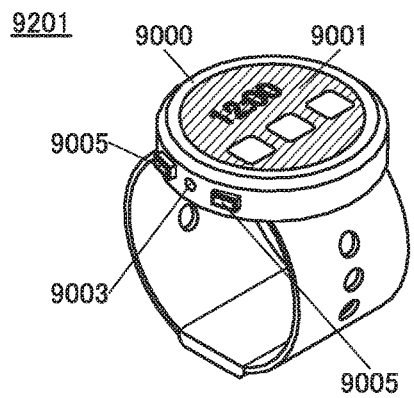

FIG. 21A is a perspective view of a watch-type portable information terminal 9200. FIG. 21B is a perspective view of a watch-type portable information terminal 9201.

The portable information terminal 9200 illustrated in FIG. 21A is capable of executing a variety of applications such as mobile phone calls, e-mailing, viewing and editing texts, music reproduction, Internet communication, and computer games. The display surface of the display portion 9001 is curved, and an image can be displayed on the curved display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal 9200 illustrated in FIG. 21A, the display surface of the display portion 9001 is not curved in the portable information terminal 9201 illustrated in FIG. 21B. Furthermore, the external shape of the display portion of the portable information terminal 9201 is a non-rectangular shape (a circular shape in FIG. 21B).

Figure 21C:
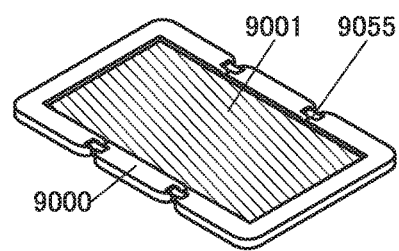
Figure 21D:
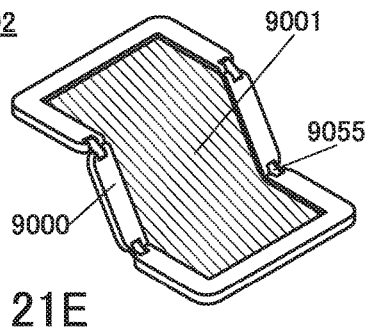
Figure 21E:
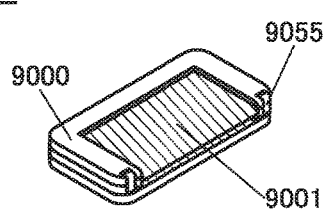

FIGS. 21C to 21E are perspective views of a foldable portable information terminal 9202. FIG. 21C is a perspective view illustrating the portable information terminal 9202 that is opened. FIG. 21D is a perspective view illustrating the portable information terminal 9202 that is being opened or being folded. FIG. 21E is a perspective view illustrating the portable information terminal 9202 that is folded.

The folded portable information terminal 9202 is highly portable, and the opened portable information terminal 9202 is highly browsable due to a seamless large display region.

The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any of the other embodiments as appropriate.

Embodiment 4

Described in this embodiment is an oxide semiconductor that can be used in a semiconductor layer of a transistor disclosed in one embodiment of the present invention.

The oxide semiconductor is a type of a metal oxide. That is, metal oxides are classified into an oxide insulator, an oxide conductor (including a transparent oxide conductor), an oxide semiconductor (also simply referred to as an OS), and the like. A metal oxide used in a semiconductor layer of a transistor is referred to an oxide semiconductor. A metal oxide that has at least one of an amplifying function, a rectifying function, and a switching function can be called a metal oxide semiconductor, or OS for short. An OS FET refers to a transistor including a metal oxide or an oxide semiconductor.

A metal oxide including nitrogen is referred to as a metal oxynitride. The semiconductor layer may include a metal oxynitride.

An oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

An oxide semiconductor including indium, gallium, and zinc is referred to as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (x0 is a real number greater than or equal to −1 and less than or equal to 1; m0 is a given number).

Examples of the crystalline structure include a single crystal structure, a polycrystalline structure, and a c-axis aligned crystalline (CAAC) structure. The CAAC structure has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

In a material composition including In, Ga, Zn, and O, nanoparticle regions including Ga as a main component are observed partly and nanoparticle regions including In as a main component are observed partly. These nanoparticle regions are randomly dispersed to form a mosaic pattern. This material composition is referred to as a cloud-aligned composite (CAC) in some cases.

That is, the aforementioned CAAC refers to an example of a crystal structure, and the aforementioned CAC refers to an example of a function or a material composition.

CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions having the above conducting function and insulating regions having the above insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel region of a transistor, high current drive capability in the on state of the transistor, that is, high on-state current and high field-effect mobility, can be obtained.

In other words, the CAC-OS or the CAC-metal oxide can be referred to as a matrix composite or a metal matrix composite.

A semiconductor element including CAC-OS has high reliability. Hence, the CAC-OS is suitably used in a display device and a semiconductor device typified by a display.

This embodiment can be combined with any of the other embodiments as appropriate.

This application is based on Japanese Patent Application Serial No. 2016-159845 filed with Japan Patent Office on Aug. 17, 2016, the entire contents of which are hereby incorporated by reference.

What is claimed is:
1. A display device comprising:
a first display element; and
a second display element over the first display element,
wherein the first display element has a convex-concave shape,
wherein the second display element includes an electrode configured to reflect visible light,
wherein the first display element is electrically connected to a first transistor,
wherein the second display element is electrically connected to a second transistor through the electrode, wherein any one of layers included in the first display element includes a first opening, wherein the electrode includes a first region and a second region, wherein the first region includes a second opening overlapping with the convex-concave shape, and wherein the second region includes a region provided in the first opening.

2. The display device according to claim 1, wherein the first opening is provided in a light-emitting layer included in the first display element.

3. The display device according to claim 1, wherein an electrode of the first display element includes a third region and a fourth region, wherein the third region is covered with a partition, wherein the fourth region includes a region provided in a third opening, wherein a surface of the fourth region has a concave portion, and wherein the concave portion is not covered with the partition.

4. The display device according to claim 1, wherein the first display element is a light-emitting element, and wherein the second display element is a liquid crystal element.

5. The display device according to claim 1, wherein the first transistor or the second transistor includes a channel formation region formed in a metal oxide layer.

6. The display device according to claim 1, wherein the second display element includes a second electrode over the electrode, and wherein the second electrode includes a region overlapping with the second opening.

7. A display device comprising:

a first display element over an insulating film; and a second display element over the first display element, wherein a surface of the insulating film has a first convex-concave shape, wherein the first display element has a second convex-concave shape along the first convex-concave shape, wherein the second display element includes an electrode configured to reflect visible light, wherein the first display element is electrically connected to a first transistor, wherein the second display element is electrically connected to a second transistor through the electrode, wherein any one of layers included in the first display element includes a first opening, wherein the electrode includes a first region and a second region, wherein the first region includes a second opening overlapping with the second convex-concave shape, and wherein the second region includes a region provided in the first opening.

8. The display device according to claim 7, wherein the first opening is provided in a light-emitting layer included in the first display element.

9. The display device according to claim 7, wherein an electrode of the first display element includes a third region and a fourth region, wherein the third region is covered with a partition, wherein the fourth region includes a region provided in a third opening, wherein a surface of the fourth region has a concave portion, and wherein the concave portion is not covered with the partition.

10. The display device according to claim 7, wherein the first display element is a light-emitting element, and wherein the second display element is a liquid crystal element.

11. The display device according to claim 7, wherein the first transistor or the second transistor includes a channel formation region formed in a metal oxide layer.

12. The display device according to claim 7, wherein the second display element includes a second electrode over the electrode, and wherein the second electrode includes a region overlapping with the second opening.

13. A display device comprising:

a first display element over an insulating film; and a second display element over the first display element, wherein a surface of the insulating film has a first convex-concave shape, wherein the first display element has a second convex-concave shape along the first convex-concave shape, wherein the second display element includes an electrode configured to reflect visible light, and wherein the electrode includes an opening overlapping with the second convex-concave shape.

14. The display device according to claim 13, wherein the first display element is a light-emitting element, and wherein the second display element is a liquid crystal element.

* * * * *